United States Patent
Kim et al.

(10) Patent No.: US 11,856,839 B2
(45) Date of Patent: Dec. 26, 2023

(54) LIGHT-EMITTING DEVICE AND APPARATUS INCLUDING THE SAME

(71) Applicant: Samsung Display Co., Ltd., Yongin-si (KR)

(72) Inventors: Dongchan Kim, Yongin-si (KR); Jiyoung Moon, Yongin-si (KR); Jihwan Yoon, Yongin-si (KR); Donghui Lee, Yongin-si (KR); Jihye Lee, Yongin-si (KR); Chulsoon Lee, Yongin-si (KR); Hakchoong Lee, Yongin-si (KR); Haemyeong Lee, Yongin-si (KR); Yoonhyeung Cho, Yongin-si (KR); Wonsuk Han, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 342 days.

(21) Appl. No.: 17/038,768

(22) Filed: Sep. 30, 2020

(65) Prior Publication Data

US 2021/0273181 A1  Sep. 2, 2021

(30) Foreign Application Priority Data

Feb. 26, 2020 (KR) .................. 10-2020-0023838

(51) Int. Cl.
*H10K 50/10* (2023.01)
*H10K 85/30* (2023.01)
(Continued)

(52) U.S. Cl.
CPC ............ *H10K 85/342* (2023.02); *C09K 11/06* (2013.01); *H10K 85/346* (2023.02);
(Continued)

(58) Field of Classification Search
CPC ... H01L 27/30; H01L 27/3239; H01L 31/143; H01L 31/162; H01L 33/08; H01L 33/18;
(Continued)

(56) References Cited

U.S. PATENT DOCUMENTS 7,560,862 B2  7/2009  Liao et al.
10,158,095 B2  12/2018  Kim et al.
(Continued)

FOREIGN PATENT DOCUMENTS

EP  3 460 859  3/2019
KR  10-1003130  12/2010
(Continued)

OTHER PUBLICATIONS

Edith Rogers, "Engineering the electronic structure of lanthanide based materials", New Journal of Physics, 13, 093038, 2011.
(Continued)

*Primary Examiner* — Moin M Rahman
(74) *Attorney, Agent, or Firm* — KILE PARK REED & HOUTTEMAN PLLC

(57) ABSTRACT

A light-emitting device and a method of manufacturing the same are provided. The light-emitting device may include a first electrode, a second electrode, and an interlayer located between the first electrode and the second electrode. The interlayer may include an emission layer that includes a first material, a second material, and a third material. The first material may include an inorganic semiconductor compound, an inorganic insulator compound, or any combination thereof. The second material may include a lanthanide metal. The third material may include an organic compound. An apparatus including the light-emitting device is provided.

15 Claims, 3 Drawing Sheets

(51) Int. Cl.
  *C09K 11/06* (2006.01)
  *H10K 50/11* (2023.01)
  *H10K 50/15* (2023.01)
  *H10K 50/16* (2023.01)
  *H10K 50/17* (2023.01)
  *H10K 50/18* (2023.01)

(52) U.S. Cl.
  CPC ........ *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02)

(58) Field of Classification Search
  CPC ... H01L 33/24; H01L 51/5032; H01L 25/048; H01L 27/288; H01L 27/32; H01L 33/06; H01L 33/26; H01L 51/0032; H01L 51/50; H01L 2251/50; H01L 51/5068; H01L 51/5084; H01L 51/5296; H01L 2051/0032; H01L 2227/32; H01L 51/0085; H01L 51/006; H01L 51/0061; H01L 51/0074; H01L 51/5016; H01L 51/0059; H01L 51/0072; H01L 51/0052; H01L 51/0056; H01L 51/0058; H01L 2251/5376; H01L 2251/5384; H01L 2251/552; H01L 51/5012; H01L 51/504; H01L 51/5209; H01L 27/3262; H01L 27/3258; H01L 27/3248; H01L 27/322; H01L 51/5225; H01L 51/5268; H01L 2251/558; H01L 2251/303; H01L 2251/306; H01L 2251/308; H01L 51/5218; H01L 51/5271; H01L 51/5275; H01L 51/0005; H01L 51/5206; H01L 51/5221; H01L 51/56; H01L 27/3244; H01L 2227/323; C09K 11/025; C09K 11/06; C09K 2211/1007; C09K 2211/1074; C09K 2211/185; C09K 11/77; C07D 239/26; C07D 241/12; C07D 333/76; C07D 409/10; C07D 471/04; C07D 209/86; C07F 15/0033; C07F 15/00; H10K 50/00–88; H10K 59/00–95; H10K 65/00; H10K 71/00–861; H10K 85/00–791; H10K 2101/00–90; H10K 2102/00–361; H10K 59/35; H10K 50/11; H10K 50/156; H10K 85/615; H10K 85/624; H10K 85/626; H10K 85/631; H10K 85/633; H10K 85/636; H10K 85/6572; H10K 2101/30; H10K 2101/40; H10K 50/155; H10K 50/852; H10K 50/115; H10K 50/13; H10K 50/80; H10K 85/6574; H10K 85/342; H10K 85/346; H10K 50/15; H10K 50/16; H10K 50/17; H10K 50/171; H10K 50/18; H10K 85/322; H10K 50/12; H10K 50/165; H10K 50/805; H10K 59/12; H10K 59/38; H10K 85/321; H10K 85/654; H10K 2102/10; H10K 2102/101; H10K 2102/102; H10K 2102/103; H10K 2102/20; H10K 2102/301; H10K 2102/302; H10K 2102/3023; H10K 2102/3026; H10K 2102/3031; H10K 2102/3035; H10K 2102/311; H10K 2102/321; H10K 2102/331; H10K 2102/341; H10K 50/10–19
  See application file for complete search history.

(56) References Cited

U.S. PATENT DOCUMENTS

| | | |
|---|---|---|
| 10,181,572 B2 | 1/2019 | Kim et al. |
| 10,636,350 B2 | 4/2020 | Kim et al. |
| 2006/0087225 A1 | 4/2006 | Liao et al. |
| 2009/0001878 A1 | 1/2009 | Qiu et al. |
| 2019/0013492 A1 | 1/2019 | Jankus et al. |
| 2019/0096318 A1* | 3/2019 | Kim ................ C09K 11/02 |
| 2019/0315760 A1* | 10/2019 | Jeon ................ H01L 51/0058 |
| 2019/0375768 A1* | 12/2019 | Kim ................ H10K 85/40 |
| 2020/0048199 A1* | 2/2020 | Baek ................ H01L 51/0067 |

FOREIGN PATENT DOCUMENTS

| | | |
|---|---|---|
| KR | 10-1232766 | 2/2013 |
| KR | 10-2016-0103596 | 9/2016 |
| KR | 10-2018-0094535 | 8/2018 |
| KR | 10-2019-0005761 | 1/2019 |
| KR | 10-2019-0034381 | 4/2019 |

OTHER PUBLICATIONS

Mikhail S. Alekhin et al., "Luminescence and spectroscopic properties of Sm2+ and Er3+ doped SrI2", Journal of Luminescence, 2015, pp. 347-351, vol. No. 167, Elsevier.

Emmanuel Rowe, "High-Performance Doped Strontium Iodide Crystal Growth Using a Modified Bridgman Method", Mar. 2014, VCU Scholars Compass, Virginia Commonwealth University, pp. 1-119.

Harry Ramanantoanina et al., "Prospecting Lighting Applications with Ligand Field Tools and Density Functional Theory: A First-Principles Account of the 4f7-4f65d1 Luminescence of CsMgBr3:Eu2+", Inorganic Chemistry, Aug. 13, 2015, pp. 8319-8326, vol. 54, No. 17.

* cited by examiner

LIGHT-EMITTING DEVICE AND APPARATUS INCLUDING THE SAME

CROSS-REFERENCE TO RELATED APPLICATION(S)

This application claims priority to and benefits of Korean Patent Application No. 10-2020-0023838 under 35 U.S.C. § 119, filed on Feb. 26, 2020, in the Korean Intellectual Property Office, the entire contents of which are incorporated herein by reference.

BACKGROUND

1. Technical Field

Embodiments relate to a light-emitting device and an apparatus including the same.

2. Description of the Related Art

Light-emitting devices are a device in which electrical energy is converted into light energy. Examples of such light-emitting devices include organic light-emitting devices using organic materials for an emission layer, quantum dot light-emitting devices using quantum dots for an emission layer, and the like.

In a light-emitting device, a first electrode is disposed on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state to thereby generate light.

SUMMARY

Provided is a light-emitting device including an inorganic material and an organic material in an emission layer and an apparatus including the same.

Aspects of the invention will be set forth in part in the description which follows and, in part, will be apparent from the description, or may be learned by practice of the embodiments of the disclosure.

In an embodiment, a light-emitting device may include a first electrode, a second electrode, and an interlayer located between the first electrode and the second electrode. The interlayer may include an emission layer that may include a first material, a second material, and a third material. The first material may include an inorganic semiconductor compound, an inorganic insulator compound, or any combination thereof. The second material may include a lanthanide metal. The third material may include an organic compound.

In an embodiment, the first material may include an alkali metal halide, an alkaline earth metal halide, a lanthanide metal halide, a transition metal halide, a post-transition metal halide, a tellurium, a lanthanide metal telluride, a transition metal telluride, a post-transition metal telluride, a lanthanide metal selenide, a transition metal selenide, a post-transition metal selenide, or any combination thereof. The second material may include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or any combination thereof. The third material may include an organic fluorescent dopant compound, an organometallic phosphorescent dopant compound, an organic delayed fluorescence dopant compound, or any combination thereof.

In an embodiment, the first material may include NaI, KI, RbI, CsI, NaCl, KCl, RbCl, CsCl, NaBr, KBr, RbBr, CsBr, $MgI_2$, $CaI_2$, $SrI_2$, $BaI_2$, $MgCl_2$, $CaCl_2$), $SrCl_2$, $BaCl_2$, $MgBr_2$, $CaBr_2$, $SrBr_2$, $BaBr_2$, $EuI_3$, $YbI_3$, $SmI_3$, $TmI_3$, $EuI_2$, $YbI_2$, $SmI_2$, $TmI_2$, $EuCl_3$, $YbC_3$, $SmCl_3$, $TmCl_3$, $EuBr_3$, $YbBr_3$, $SmBr_3$, $TmBr_3$, AgI, CuI, $NiI_2$, $CoI_2$, $BiI_3$, $PbI_2$, $SnI_2$, Te, EuTe, YbTe, SmTe, TmTe, EuSe, YbSe, SmSe, TmSe, ZnTe, CoTe, ZnSe, CoSe, $Bi_2Te_3$, $Bi_2Se_3$, or any combination thereof.

In an embodiment, the first material may include KI, RbI, CsI, CuI, or any combination thereof.

In an embodiment, the second material may include Yb, Tm, Sm, Eu, Er, or any combination thereof.

In an embodiment, a volume of the first material may be greater than or equal to a volume of the second material.

In an embodiment, the first electrode may be an anode, the second electrode may be a cathode, and the interlayer may further include at least one of a hole transport region located between the first electrode and the emission layer and an electron transport region located between the emission layer and the second electrode. The hole transport region may include a hole injection layer, a hole transport layer, an electron blocking layer, or any combination thereof. The electron transport region may include a hole blocking layer, an electron transport layer, an electron injection layer, or any combination thereof.

In an embodiment, the hole injection layer may include a fourth material and a fifth material, the fourth material and the fifth material, and the fourth material and the fifth material may be different from each other. The fourth material may include a lanthanide metal halide, a transition metal halide, a post-transition metal halide, a tellurium, a lanthanide metal telluride, a transition metal telluride, a post-transition metal telluride, a lanthanide metal selenide, a transition metal selenide, a post-transition metal selenide, or any combination thereof. The fifth material may include a hole transport organic compound, an alkali metal halide, an alkaline earth metal halide, a lanthanide metal halide, or any combination thereof.

In an embodiment, the fifth material may include a hole transport organic compound, and the volume ratio of the fourth material to the fifth material may be in a range of about 1:99 to about 20:80.

In an embodiment, the fifth material may include a post-transition metal halide, an alkali metal halide, an alkaline earth metal halide, a lanthanide metal halide, or any combination thereof, and the volume ratio of the fourth material to the fifth material may be in a range of about 0:100 to about 50:50.

In an embodiment, the electron injection layer may include a sixth material, and the sixth material may include an alkali metal halide, an alkaline earth metal halide, a lanthanide metal halide, or any combination thereof.

In an embodiment, the electron injection layer may consist of the sixth material.

In an embodiment, the electron injection layer may further include a seventh material, and the sixth material and the seventh material may be different from each other. The seventh material may include an alkali metal, an alkaline earth metal, a lanthanide metal, or any combination thereof.

In an embodiment, the sixth material may be represented by Formula X, and the seventh material may be represented by Formula Y:

$$A_nB_m \quad \text{<Formula X>}$$

$$C \quad \text{<Formula Y>}$$

In Formulae X and Y,
A and C may each independently include an alkali metal, an alkaline earth metal, a lanthanide metal, or any combination thereof,
B may be a halogen,
n and m may each independently be an integer of 1 or more that makes the sixth material neutral, and
A and C may be different from each other.

In an embodiment, the hole transport layer may be in direct contact with the emission layer, and the hole transport layer may include an eighth material and a ninth material. The eighth material and the ninth material may be different from each other, the eighth material may include at least one hole transport organic compound, and the ninth material may include an alkali metal halide, an alkaline earth metal halide, a lanthanide metal halide, or any combination thereof.

In an embodiment, the electron transport layer may be in direct contact with the emission layer, and the electron transport layer may include a tenth material and an eleventh material. The tenth material and the eleventh material may be different from each other, the tenth material may include at least one electron transport organic compound, and the eleventh material may include an alkali metal halide, an alkaline earth metal halide, a lanthanide metal halide, or any combination thereof.

In an embodiment, a light-emitting device may include a first electrode, a second electrode facing the first electrode, light-emitting units located between the first electrode and the second electrode, and charge generating units each located between neighboring ones of the light-emitting units. Each of the light-emitting units may include an emission layer, and at least one of the emission layers may include a first material, a second material, and a third material. The first material may include an inorganic semiconductor compound, an inorganic insulator compound, or any combination thereof. The second material may include a lanthanide metal. The third material may include an organic compound.

In an embodiment, each of the charge generating units may include an n-type charge generating layer and a p-type charge generating layer.

In an embodiment, the n-type charge generating layer may include a twelfth material and a thirteenth material. The twelfth material may include an alkali metal, an alkaline earth metal, a lanthanide metal, transition metal, a post-transition metal, or any combination thereof. The thirteenth material may include an electron transport organic compound. The p-type charge generating layer may include a fourteenth material and a fifteenth material. The fourteenth material may include a hole transport organic compound, an inorganic insulator compound, or any combination thereof. The fifteenth material may include an inorganic semiconductor compound.

In an embodiment, an apparatus may include a thin-film transistor and the light-emitting device. The thin film transistor may include a source electrode, a drain electrode, and an activation layer. The first electrode of the light-emitting device may be electrically connected with one of the source electrode and the drain electrode of the thin-film transistor.

In an embodiment, the apparatus may further include a color filter, and the color filter may be located on a path through which light from the light-emitting device is emitted.

BRIEF DESCRIPTION OF THE DRAWINGS

The above and other aspects, features, and advantages of the embodiments of the disclosure will be more apparent from the following description taken in conjunction with the accompanying drawings, in which.

DETAILED DESCRIPTION OF THE EMBODIMENTS

Figure 1:
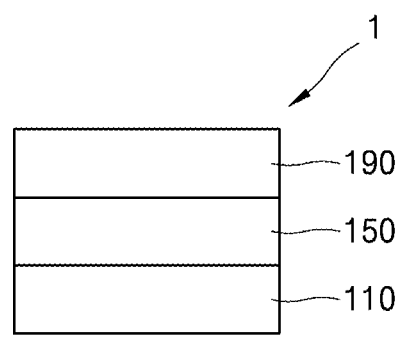
FIGS. 1 to 4 show schematic cross-sectional views of a light-emitting device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or". Throughout the disclosure, the expression "at least one of A, B, or C" may indicate only A, only B, only C, both A and B, both A and C, both B and C, all of A, B, and C, or variations thereof.

The term "at least one of" is intended to include the meaning of "at least one selected from the group consisting of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

As the disclosure can apply various transformations and can have various examples, specific examples will be illustrated in the drawings and described in detail in the detailed description. Effects and features of the disclosure, and methods of achieving the same will be clarified by referring to Examples described in detail later with reference to the drawings. However, the disclosure is not limited to the examples disclosed below and may be implemented in various forms.

Hereinafter, embodiments will be described in detail with reference to the accompanying drawings. The same or corresponding components will be denoted by the same reference numerals, and thus redundant description thereof will be omitted.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises", "comprising", "includes", "including", "contains", and/or "containing" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. For example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

It will be understood that when a layer, region, or component is referred to as being "connected to" another layer, region, or component, the layer, region, or component may be directly connected to the another layer, region, or component, or indirectly connected to the another layer, region, or component as intervening layer, region, or component is present. For example, it will be understood that when a layer, region, or component is referred to as being "physically connected to" another layer, region, or component, the layer, region, or component may be directly physically connected to the another layer, region, or component, or indirectly physically connected to the another layer, region, or component as intervening layer, region, or component is present. For example, it will be understood that when a layer, region, or component is referred to as being "electrically connected to" another layer, region, or component, the layer, region, or component may be directly electrically connected to the another layer, region, or component, or indirectly electrically connected to the another layer, region, or component as intervening layer, region, or component is present.

The term "interlayer" as used herein refers to a single layer and/or all layers between a first electrode and a second electrode of a light-emitting device. A material included in the "interlayer" may be an organic material and/or an inorganic material.

The expression "(an interlayer) includes at least one compound represented by Formula 1" as used herein may include a case in which "(an interlayer) includes identical compounds represented by Formula 1" and a case in which "(an interlayer) includes two or more different compounds represented by Formula 1".

In the specification, the term "Group" refers to a group on the IUPAC Periodic Table of Elements.

The term "inorganic semiconductor compound" as used herein refers to any compound being an inorganic material and having a band gap of less than 4 eV. In an embodiment, an inorganic semiconductor compound may include a lanthanide metal halide, a transition metal halide, a post-transition metal halide, a tellurium, a lanthanide metal telluride, a transition metal telluride, a post-transition metal telluride, a lanthanide metal selenide, a transition metal selenide, a post-transition metal selenide, or any combination thereof. In an embodiment, the inorganic semiconductor compound may include $EuI_2$, $YbI_2$, $SmI_2$, $TmI_2$, AgI, CuI, $NiI_2$, $CoI_2$, $BiI_3$, $PbI_2$, $SnI_2$, Te, EuTe, YbTe, SmTe, TmTe, EuSe, YbSe, SmSe, TmSe, ZnTe, CoTe, ZnSe, CoSe, $Bi_2Te_3$, $Bi_2Se_3$, or any combination thereof.

The term "inorganic insulator compound" as used herein refers to any compound being an inorganic material and having a band gap of 4 eV or more. In an embodiment, the inorganic insulator compound may include an alkaline earth metal halide, a lanthanide metal halide, or any combination thereof. An inorganic insulation compound may include NaI, KI, RbI, CsI, NaCl, KCl, RbCl, CsCl, NaF, KF, RbF, CsF, $MgI_2$, $CaI_2$, $SrI_2$, $BaI_2$, $MgCl_2$, $CaCl_2$), $SrCl_2$, $BaCl_2$, $MgF_2$, $CaF_2$, $SrF_2$, $BaF_2$, $EuI_3$, $YbI_3$, $SmI_3$, $TmI_3$, $EuCl_3$, $YbCl_3$, $SmCl_3$, $TmCl_3$, $EuF_3$, $YbF_3$, $SmF_3$, $TmF_3$, or any combination thereof.

The term "alkali metal halide" as used herein refers to a compound in which alkali metal and a halogen are ionically bonded. In an embodiment, the alkali metal halide may include NaI, KI, RbI, CsI, NaCl, KCl, RbCl, CsCl, NaF, KF, RbF, CsF, or any combination thereof.

The term "alkaline earth metal halide" as used herein refers to a compound in which alkaline earth metal and a halogen are ionically bonded. In an embodiment, the alkaline earth metal halide may include $MgI_2$, $CaI_2$, $SrI_2$, $BaI_2$, $MgCl_2$, $CaCl_2$), $SrCl_2$, $BaCl_2$, $MgF_2$, $CaF_2$, $SrF_2$, $BaF_2$, or any combination thereof.

The term "lanthanide metal halide" as used herein refers to a compound in which a lanthanide metal and a halogen are ionically bonded and/or covalently bonded. In an embodiment, the lanthanide metal halide may include $EuI_2$, $YbI_2$, $SmI_2$, $TmI_2$, $EuI_3$, $YbI_3$, $SmI_3$, $TmI_3$, $EuCl_3$, $YbCl_3$, $SmCl_3$, $TmCl_3$, $EuF_3$, $YbF_3$, $SmF_3$, $TmF_3$, or any combination thereof.

The term "transition metal halide" as used herein refers to a compound in which a transition metal and a halogen are ionically bonded and/or covalently bonded. In an embodiment, the transition metal halide may include AgI, CuI, $NiI_2$, $CoI_2$, or any combination thereof.

The term "post-transition metal halide" as used herein refers to a compound in which a post-transition metal and a halogen are ionically bonded and/or covalently bonded. In an embodiment, the post-transition metal halide may include $BiI_3$, $PbI_2$, $SnI_2$, or any combination thereof.

The term "lanthanide metal telluride" as used herein refers to a compound in which a lanthanide metal and tellurium (Te) are ionically bonded, covalently bonded, and/or metallically bonded. In an embodiment, the lanthanide metal telluride may include EuTe, YbTe, SmTe, TmTe, or any combination thereof.

The term "transition metal telluride" as used herein refers to a compound in which transition metal and tellurium are ionically bonded, covalently bonded, and/or metallically bonded. In an embodiment, the transition metal telluride may include ZnTe, CoTe, or any combination thereof.

The "post-transition metal telluride" as used herein refers to a compound in which post-transition metal and tellurium are ionically bonded, covalently bonded, and/or metallically bonded. In an embodiment, the post-transition metal telluride may include $Bi_2Te_3$.

The "lanthanide metal selenide" as used herein refers to a compound in which a lanthanide metal and selenium (Se) are ionically bonded, covalently bonded, and/or metallically bonded. In an embodiment, the lanthanide metal selenide may include EuSe, YbSe, SmSe, TmSe, or any combination thereof.

The term "transition metal selenide" as used herein refers to a compound in which transition metal and selenium are ionically bonded, covalently bonded, and/or metallically bonded. In an embodiment, the transition metal selenide may include ZnSe, CoSe, or any combination thereof.

The term "post-transition metal selenide" as used herein refers to a compound in which post-transition metal and selenium are ionically bonded, covalently bonded, and/or metallically bonded compound. In an embodiment, the post-transition metal selenide may include $Bi_2Se_3$.

The term "alkali metal" as used herein refers to a Group 1 element. In an embodiment, an alkali metal may be lithium (Li), sodium (Na), potassium (K), rubidium (Rb), or cesium (Cs).

The term "alkaline earth metal" as used herein refers to a Group 2 element. In an embodiment, an alkaline earth metal may be magnesium (Mg), calcium (Ca), strontium (Sr), or barium (Ba).

The term "lanthanide metal" as used herein refers to lanthanum and a lanthanide element in the Periodic Table of Elements. In an embodiment, a lanthanide metal may be lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu).

The term "transition metal" as used herein refers to an element that belongs to the fourth-row to the seventh-row of the Periodic Table of Elements and belongs to Group 3 to Group 12 of the Periodic Table of Elements. In an embodiment, the transition metal may be titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), or cadmium (Cd).

The term "post-transition metal" as used herein refers to a metal element that belongs to the fourth-row to seventh-row of the Periodic Table of Elements and belongs to Group 13 to Group 17 of the Periodic Table of Elements. In an embodiment, the post-transition metal may be aluminum (Al), gallium (Ga), indium (In), thallium (Tl), tin (Sn), lead (Pb), bismuth (Bi), or polonium (Po).

The term "halogen" as used herein refers to a Group 17 element. In an embodiment, a halogen may be fluorine (F), chlorine (Cl), bromine (Br), or iodine (I).

[Description of FIG. 1]

FIG. 1 is a schematic cross-sectional view of a light-emitting device 1 according to an embodiment.

Referring to FIG. 1, the light-emitting device 1 according to an embodiment includes: a first electrode 110; a second electrode 190; and an interlayer 150 including an emission layer located between the first electrode and the second electrode.

The structure of the light-emitting device 1 according to an embodiment of the disclosure and a method of manufacturing the light-emitting device 1 will be described in connection with FIG. 1.

[First Electrode 110]

In FIG. 1, a substrate may be additionally located under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by, for example, depositing or sputtering a material for forming the first electrode on the substrate. When the first electrode 110 is an anode, the material for a first electrode may be selected from materials with a high work function to facilitate hole injection.

The first electrode 110 may be a reflective electrode, a semi-transmissive electrode, or a transmissive electrode. When the first electrode 110 is a transmissive electrode, a material for forming a first electrode may be selected from indium tin oxide (ITO), indium zinc oxide (IZO), tin oxide ($SnO_2$), zinc oxide (ZnO), and any combination thereof, but embodiments are not limited thereto. In embodiments, when the first electrode 110 is a semi-transmissive electrode or a reflective electrode, a material for forming a first electrode may be selected from magnesium (Mg), silver (Ag), aluminum (Al), aluminum-lithium (Al—Li), calcium (Ca), magnesium-indium (Mg—In), magnesium-silver (Mg—Ag), and any combination thereof, but embodiments are not limited thereto.

The first electrode 110 may have a single-layered structure or a multi-layered structure including two or more layers. For example, the first electrode 110 may have a three-layered structure of ITO/Ag/ITO, but the structure of the first electrode 110 is not limited thereto.

[Interlayer 150]

The middle layer 150 is located on the first electrode 110. The organic layer 150 may include an emission layer.

The interlayer 150 may further include at least one of a hole transport region located between the first electrode 110 and the emission layer and an electron transport region located between the emission layer and the second electrode 190.

In an embodiment, the first electrode may be an anode, the second electrode may be a cathode, and the interlayer may further include at least one of a hole transport region located between the first electrode and the emission layer and an electron transport region located between the emission layer and the second electrode. The hole transport region may include a hole injection layer, a hole transport layer, an electron blocking layer, or any combination thereof. The electron transport region may include a hole blocking layer, an electron transport layer, an electron injection layer, or any combination thereof.

[Hole Transport Region in Organic Layer 150]

The hole transport region may have i) a single-layered structure including a single layer including a single material, ii) a single-layered structure including a single layer including different materials, or iii) a multi-layered structure having multiple layers including different materials.

The hole transport region may include a hole injection layer, a hole transport layer, an electron blocking layer, or any combination thereof.

[Hole Injection Layer in Hole Transport Region]

The light-emitting device may include a hole injection layer contacting (e.g., directly contacting) the first electrode.

The hole injection layer may include a fourth material and a fifth material, and the fourth material and the fifth material may be different from each other.

In an embodiment, the fourth material may include a lanthanide metal halide, a transition metal halide, a post-transition metal halide, a tellurium, a lanthanide metal telluride, a transition metal telluride, a post-transition metal telluride, a lanthanide metal selenide, a transition metal selenide, a post-transition metal selenide, or any combination thereof.

In an embodiment, the volume of the fifth material in the hole injection layer may be greater than or equal to the volume of the fourth material in the hole injection layer.

In an embodiment, the volume percentage of the fourth material in the hole injection layer may be 50% or less.

In an embodiment, the fifth material may include a hole transport organic compound, an alkali metal halide, an alkaline earth metal halide, a lanthanide metal halide, or any combination thereof.

The fifth material may include at least one hole transport organic compound, and the volume ratio of the fourth material to the fifth material may be in a range of about 1:99 to about 20:80.

In an embodiment, the fifth material may include a post-transition metal halide, an alkali metal halide, an alkaline earth metal halide, a lanthanide metal halide, or any combination thereof, and the volume ratio of the fourth material to the fifth material may be in a range of about 0:100 to about 50:50. In an embodiment, the volume ratio of the fourth material to the fifth material may be in a range of about 0.01:99.99 to about 50:50. In an embodiment, the volume ratio of the fourth material to the fifth material may be in a range of about 0.1:99.9 to about 50:50. In an embodiment, the volume ratio of the fourth material to the fifth material may be in a range of about 1:99 to about 50:50. However, embodiments are not limited thereto.

The term "hole transport organic compound" as used herein refers to any organic material having hole transport property.

In an embodiment, the hole transport organic compound may include at least one selected from m-MTDATA, TDATA, 2-TNATA, NPB(NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, and a compound represented by Formula 202 below:

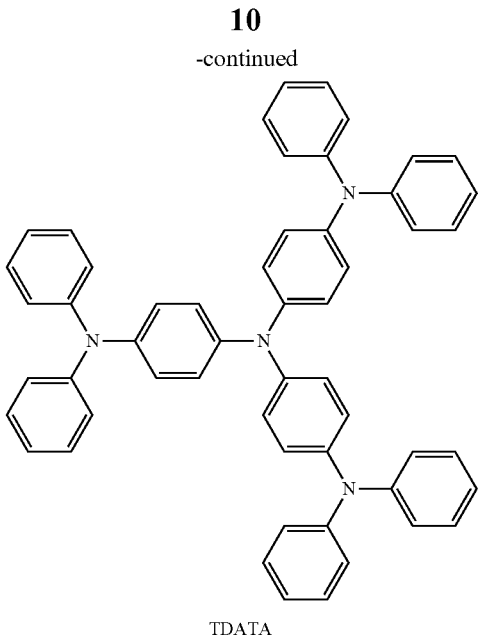

TDATA

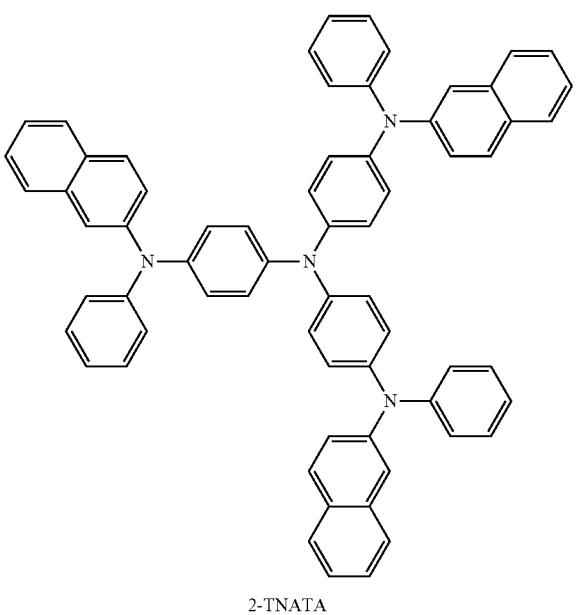

2-TNATA

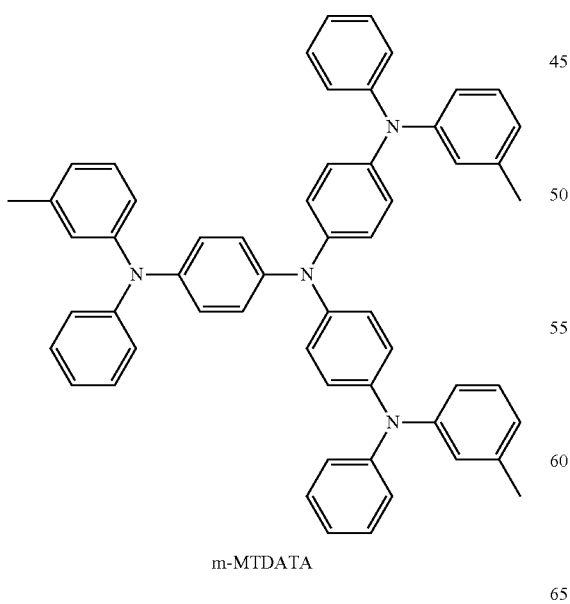

m-MTDATA

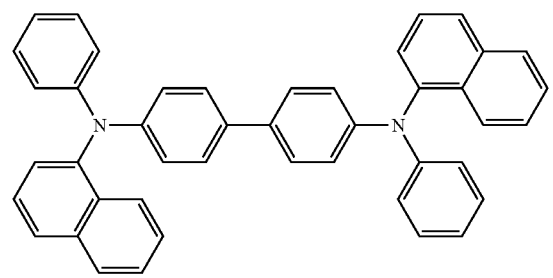

NPB

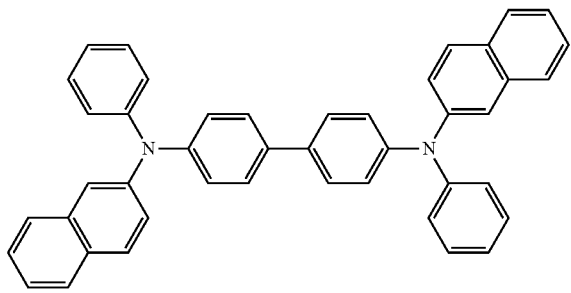

β-NPD

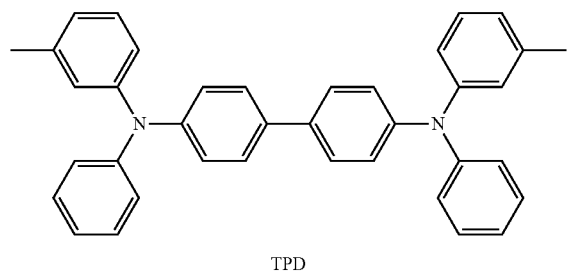

TPD

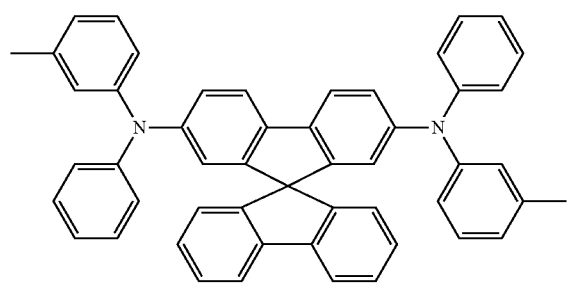

Spiro-TPD

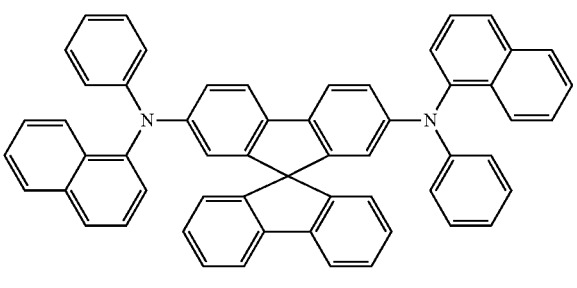

Spiro-NPB

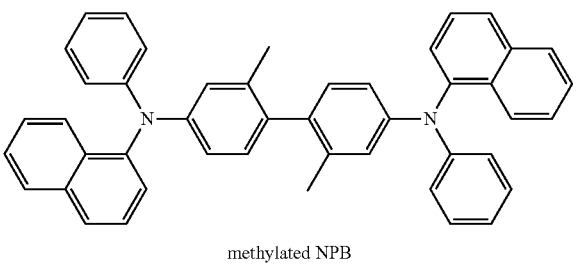

methylated NPB

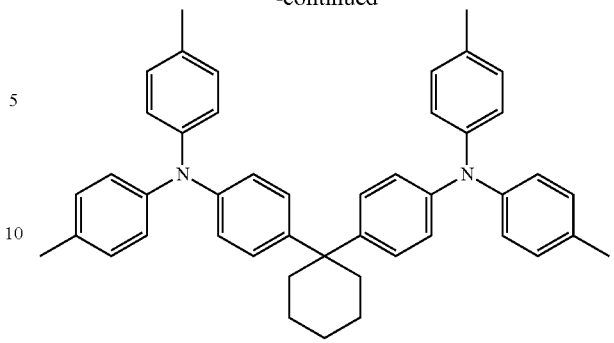

TAPC

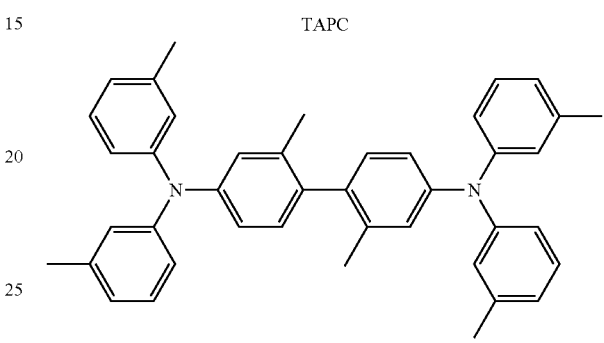

HMTPD

<Formula 201>

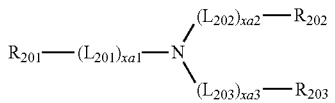

<Formula 202>

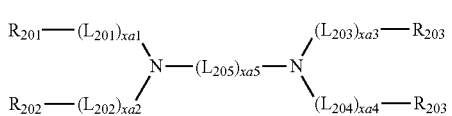

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In an embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$) and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In embodiments, xa1 to xa4 may each independently be 0, 1, or 2.

In embodiments, xa5 may be 1, 2, 3, or 4.

In embodiments, $R_{201}$ to $R_{204}$ and $Q_{201}$ may each independently be selected from: a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$ and —$N(Q_{31})(Q_{32})$, wherein $Q_{31}$ to $Q_{33}$ are the same as described above.

In embodiments, at least one selected from $R_{201}$ to $R_{203}$ in Formula 201 may each independently be selected from:
a fluorenyl group, a spiro-bifluorenyl group, a carbazolyl group, a dibenzofuranyl group, and a dibenzothiophenyl group; and
a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

In embodiments, in Formula 202, i) $R_{201}$ and $R_{202}$ may be linked to each other via a single bond, and/or ii) $R_{203}$ and $R_{204}$ may be linked to each other via a single bond.

In embodiments, $R_{201}$ to $R_{204}$ in Formula 202 may each independently be selected from:
a carbazolyl group; and
a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group,
but embodiments are not limited thereto.

In embodiments, the compound represented by Formula 201 may be represented by Formula 201A below:

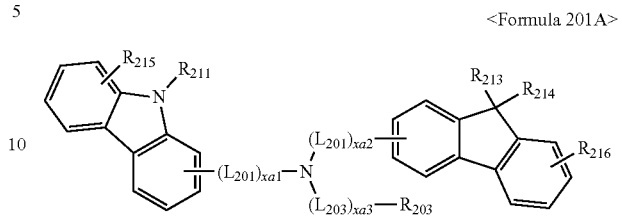

<Formula 201A>

In embodiments, the compound represented by Formula 201 may be represented by Formula 201A(1) below, but embodiments are not limited thereto:

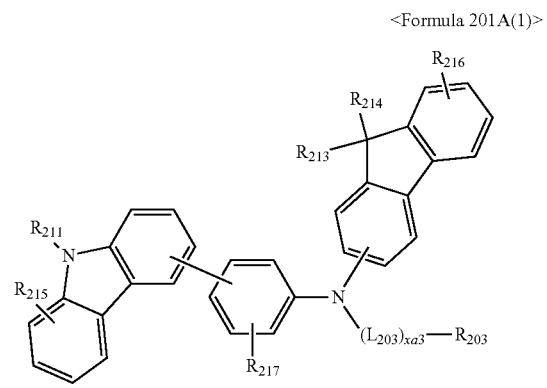

<Formula 201A(1)>

In embodiments, the compound represented by Formula 201 may be represented by Formula 201A-1 below, but embodiments are not limited thereto:

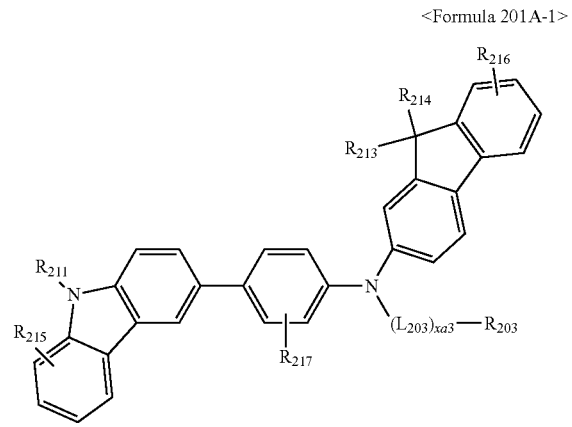

<Formula 201A-1>

In embodiments, the compound represented by Formula 202 may be represented by Formula 202A below:

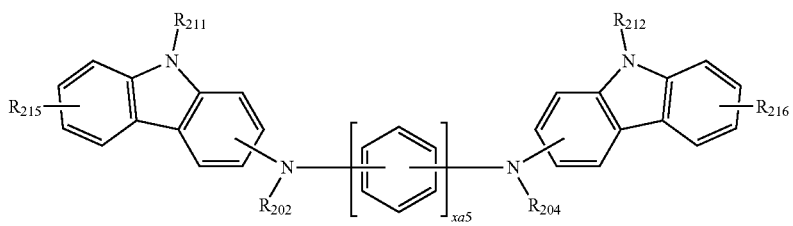

<Formula 202A>

In embodiments, the compound represented by Formula 202 may be represented by Formula 202A-1 below:

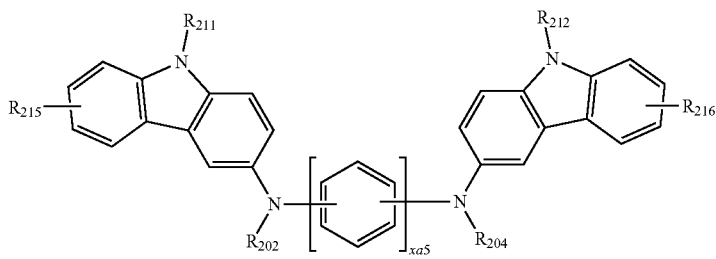

<Formula 202A-1>

In Formulae 201A, 201A(1), 201A-1, 202A, and 202A-1,
$L_{201}$ to $L_{203}$, xa1 to xa3, xa5, and $R_{202}$ to $R_{204}$ are the same as described above,
$R_{211}$ and $R_{212}$ are the same as described in connection with $R_{203}$, and
$R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from compounds HT1 to HT39, but compounds to be included in the hole transport region are not limited thereto:

HT1

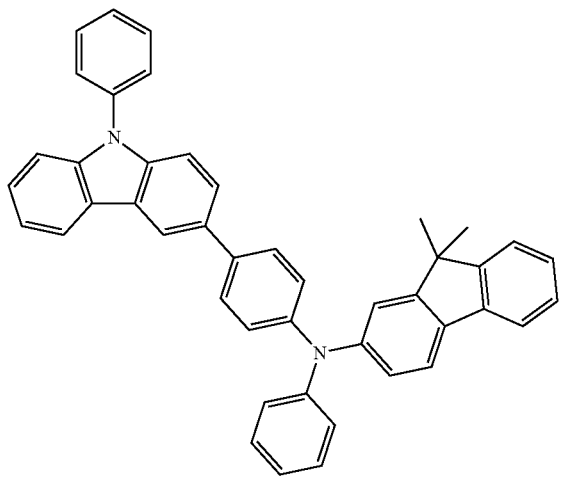

HT2

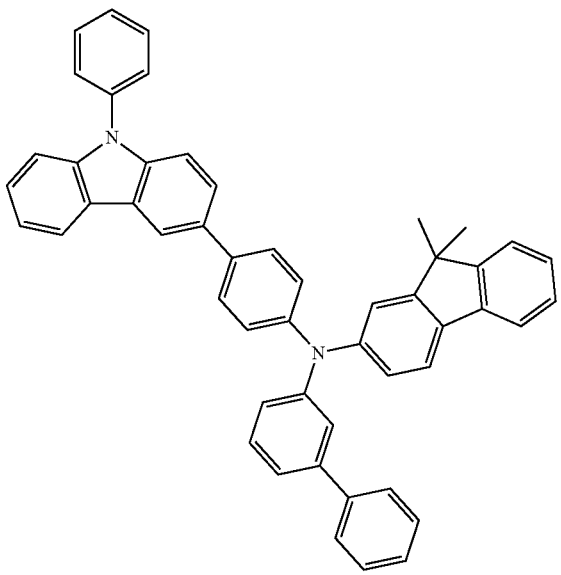

-continued
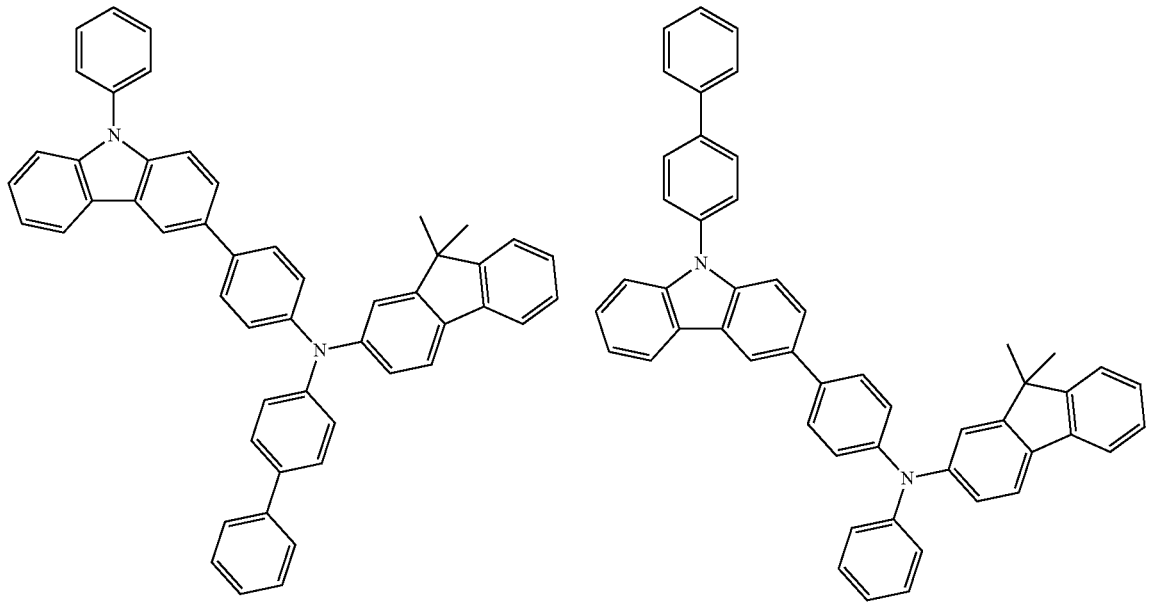
HT3  HT4
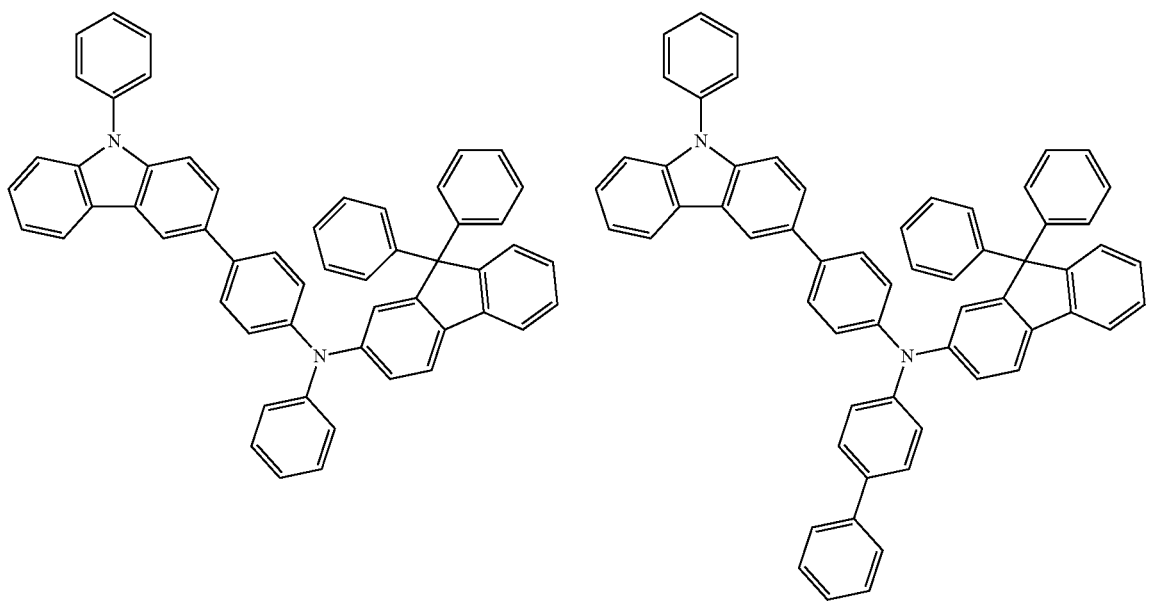
HT5  HT6

-continued
HT7
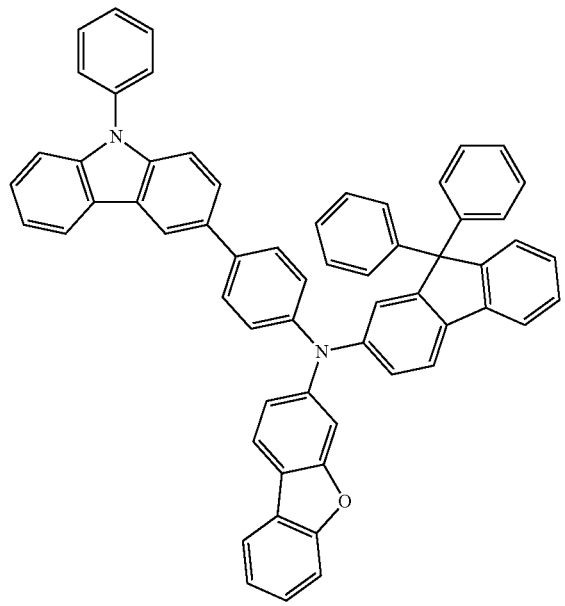
HT8
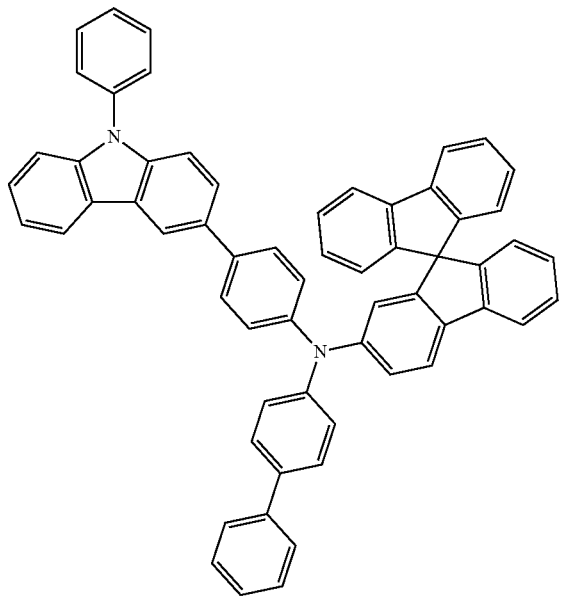
HT9
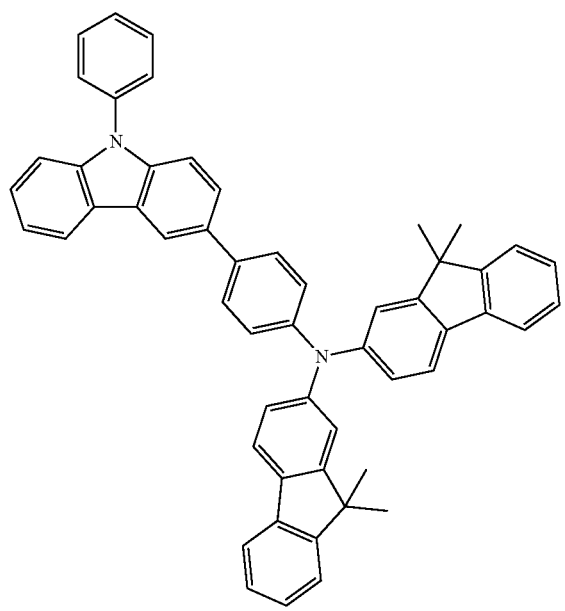
HT10
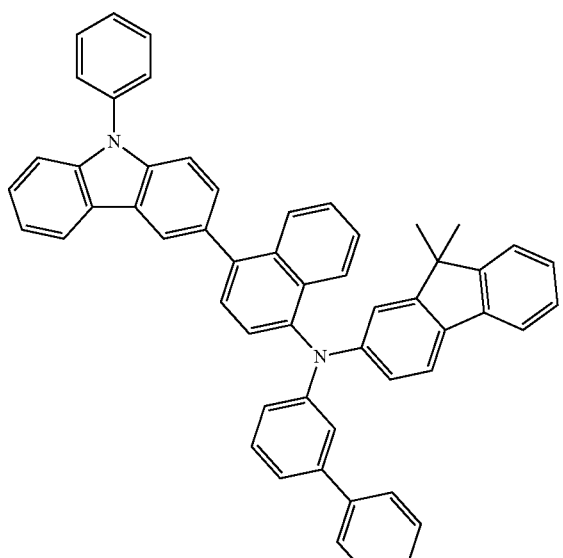

-continued
HT11
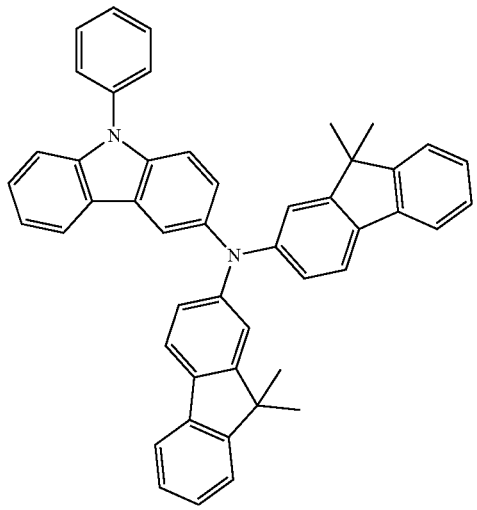
HT12
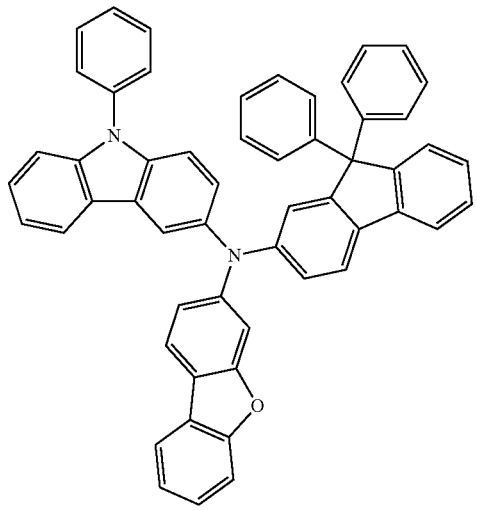
HT13
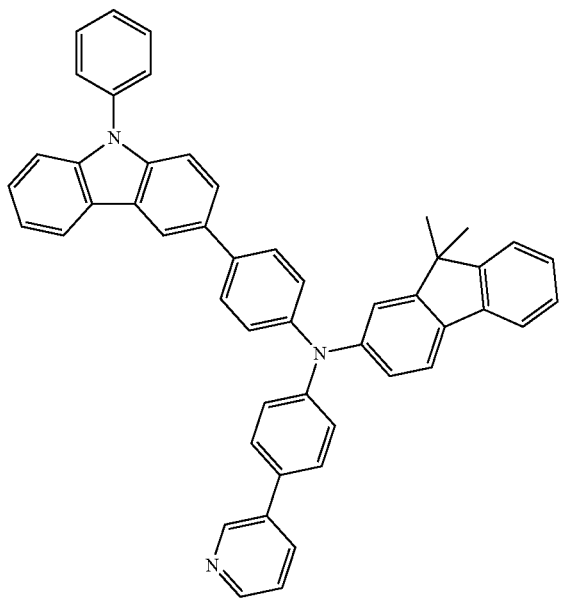
HT14
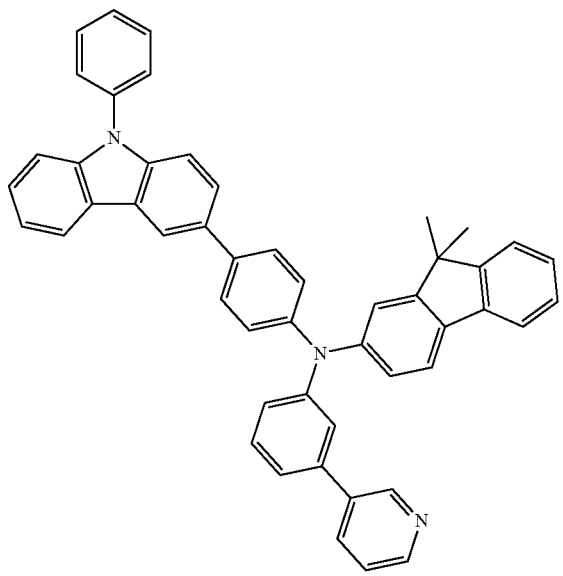
HT15
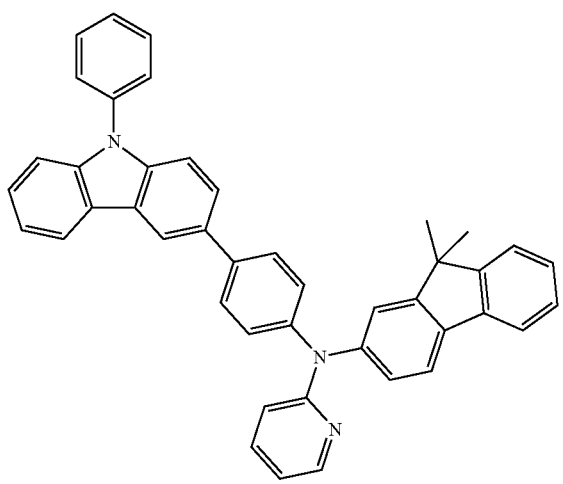
HT16
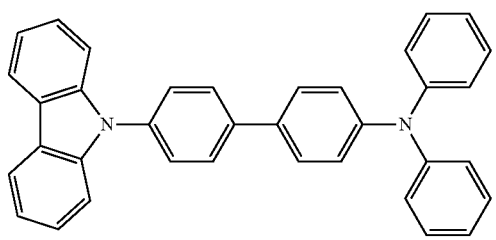

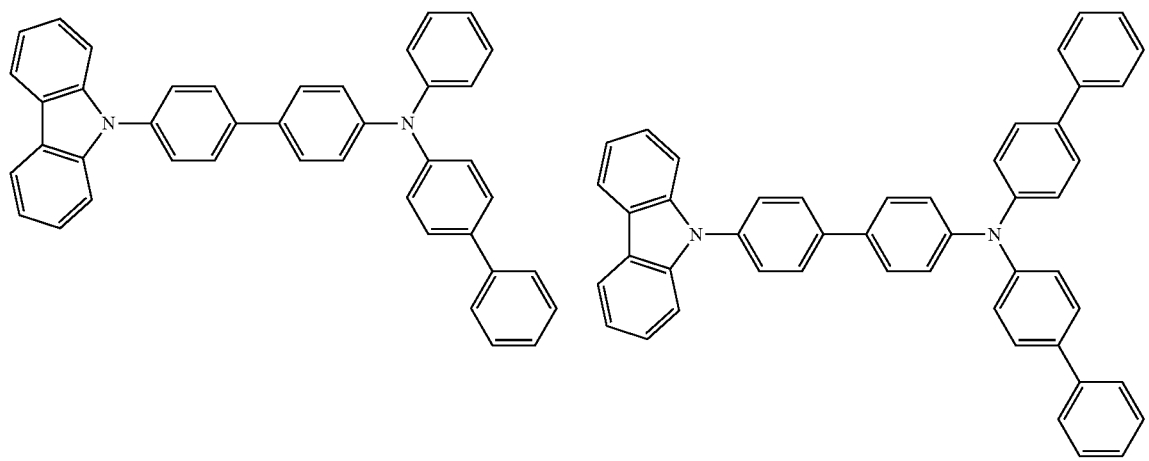
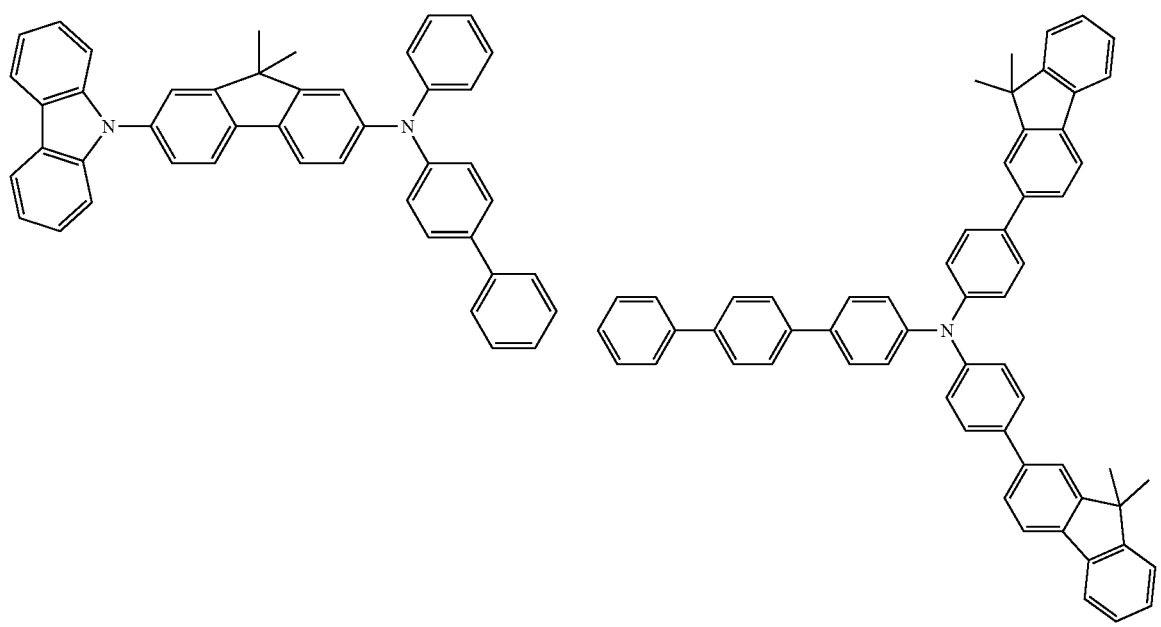

HT21
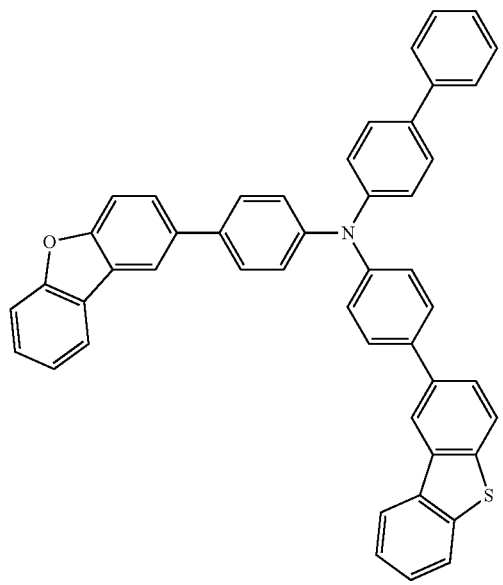
HT22
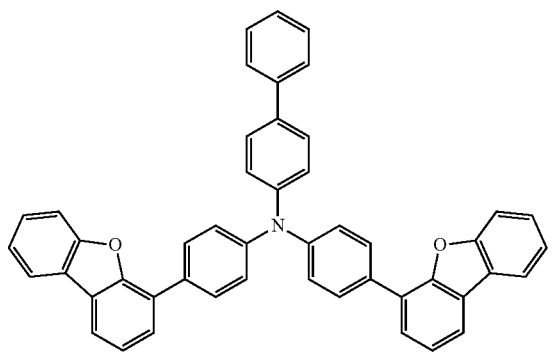
HT23
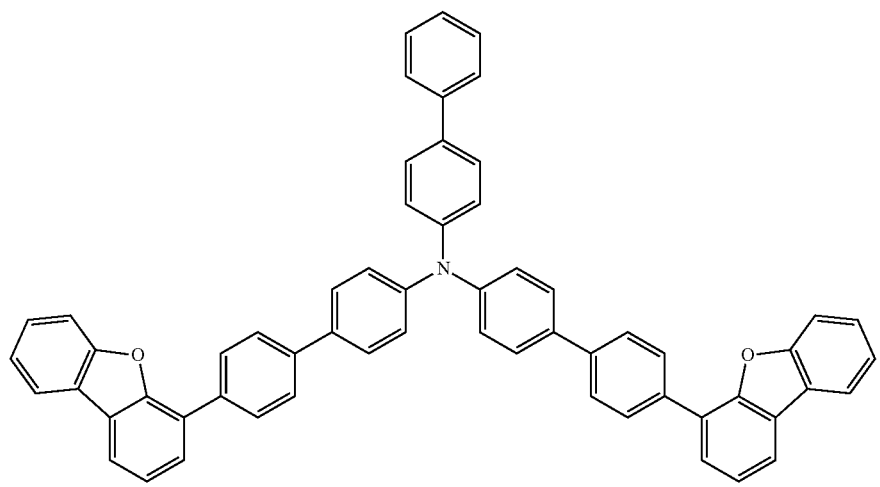
HT24
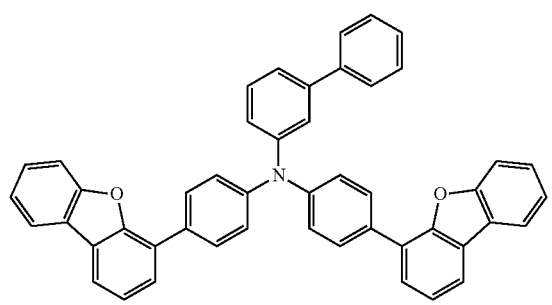
HT25
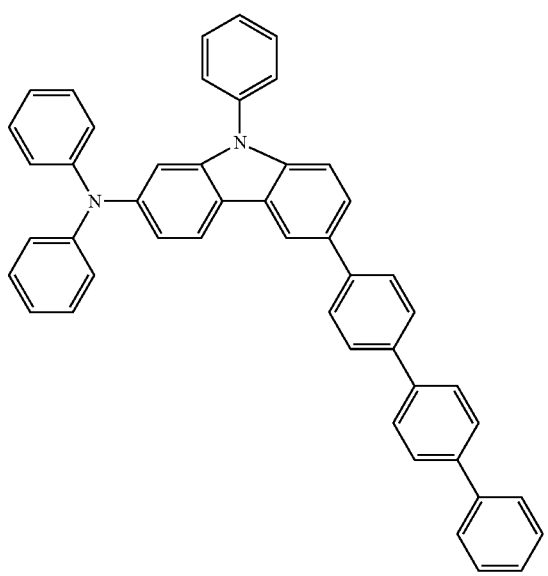

-continued
HT26
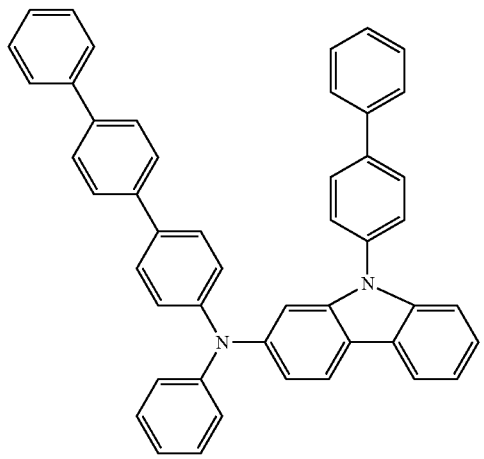
HT27
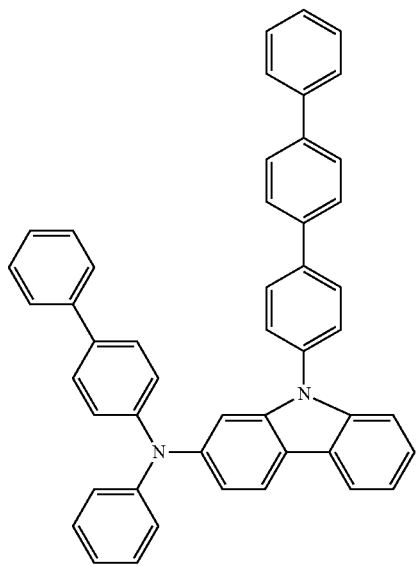
HT28
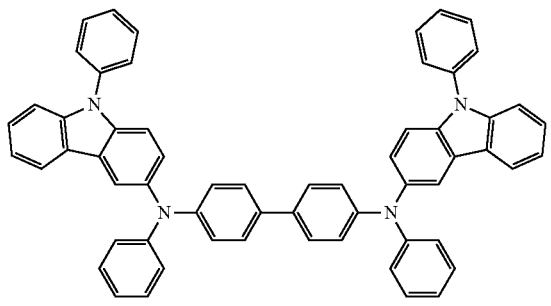
HT29
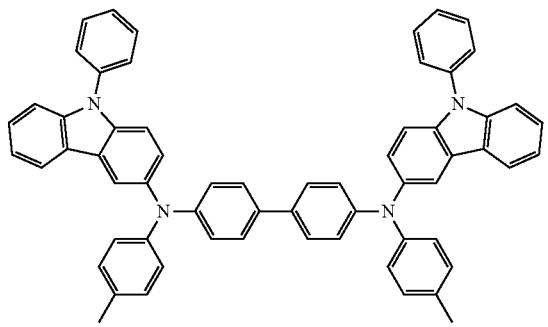
HT30
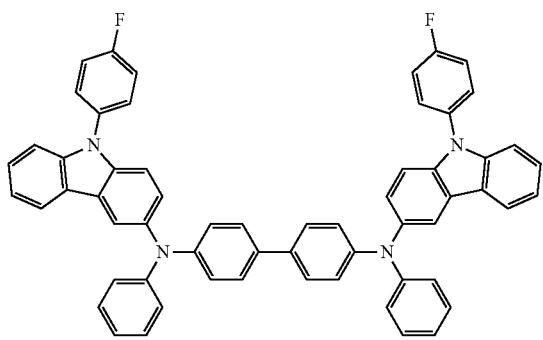
HT31
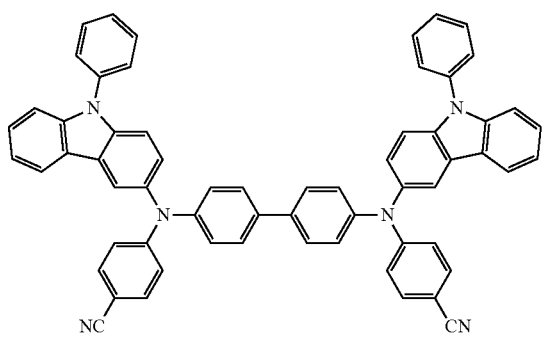

-continued
HT32
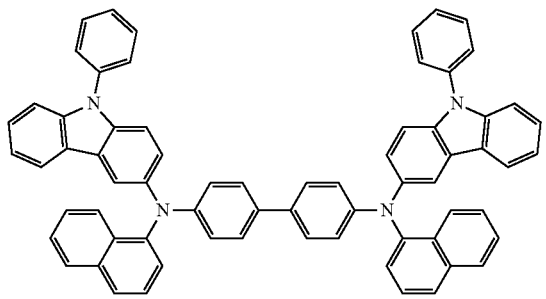
HT33
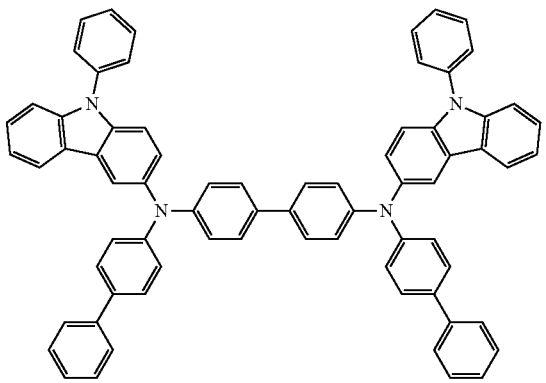
HT34
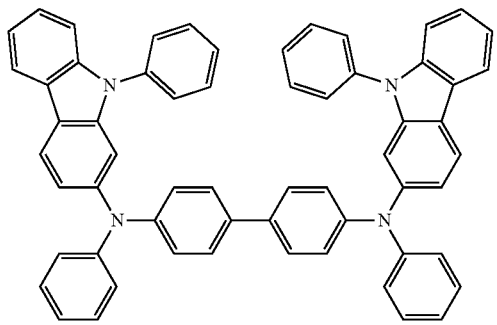
HT35
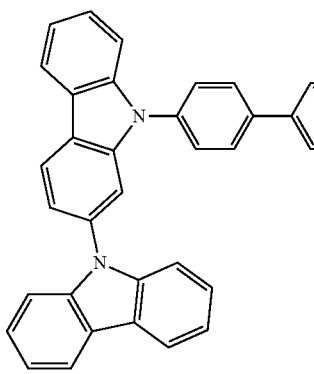
HT36
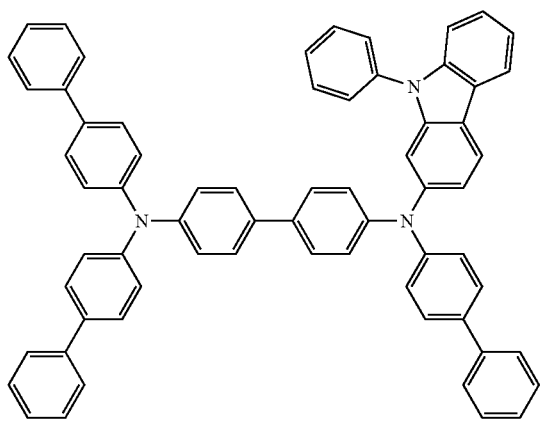
HT37
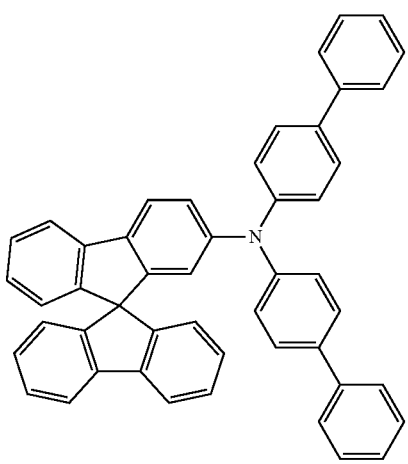

HT38

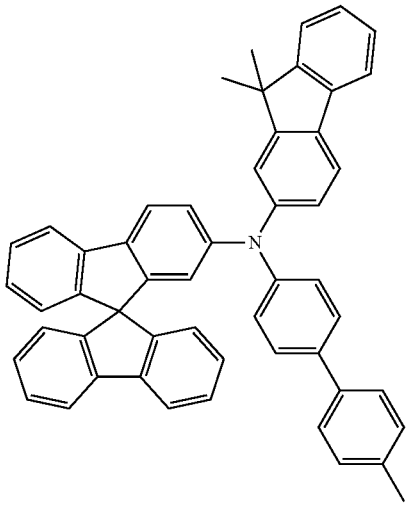

HT39

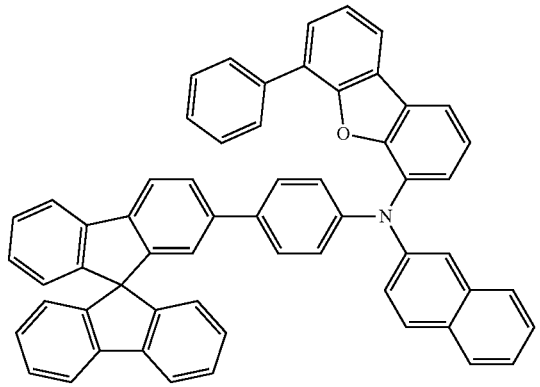

A thickness of the hole injection layer may be in a range of about 0.1 nm to about 20 nm. When the thickness of the hole injection layer is within the range, satisfactory hole injection characteristics may be obtained without a substantial increase in driving voltage.

[Hole Transport Layer in Hole Transport Region]

The light-emitting device 1 may include a hole transport layer contacting (e.g., directly contacting) the emission layer.

The hole transport layer may include an eighth material and a ninth material. The eighth material and the ninth material may be different from each other. The eighth material may include at least one hole transport organic compound, and the ninth material may include an alkali metal halide, an alkaline earth metal halide, a lanthanide metal halide, or any combination thereof.

The volume of the eighth material in the hole transport layer may be greater than the volume of the ninth material in the hole transport layer. In an embodiment, the volume ratio of the eighth material to the ninth material in the hole transport layer may be in a range of about 99:1 to about 50:50.

A thickness of the hole transport layer may be in a range of about 0.1 nm to about 10 nm. When the thickness of the hole transport layer is within the range, satisfactory hole transport characteristics may be obtained without a substantial increase in driving voltage.

[Charge-Generation Material in Hole Transport Region]

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In an embodiment, the p-dopant may have a lowest unoccupied molecular orbital (LUMO) energy level of −3.5 eV or less.

The p-dopant may include at least one of a quinone derivative, a metal oxide, and a cyano group-containing compound, but embodiments are not limited thereto.

For example, the p-dopant may include at least one selected from: a quinone derivative, such as tetracyanoquinodimethane (TCNQ) or F4-2,3,5,6-tetrafluoro-7,7,8,8-tetracyanoquinodimethane (F4-TCNQ);

a metal oxide, such as tungsten oxide or molybdenum oxide;

a transition metal halide such as CuI;

a transition metal telluride such as ZnTe;

1,4,5,8,9,11-hexaazatriphenylene-hexacarbonitrile (HAT-CN); and a compound represented by Formula 221 below, but embodiments are not limited thereto:

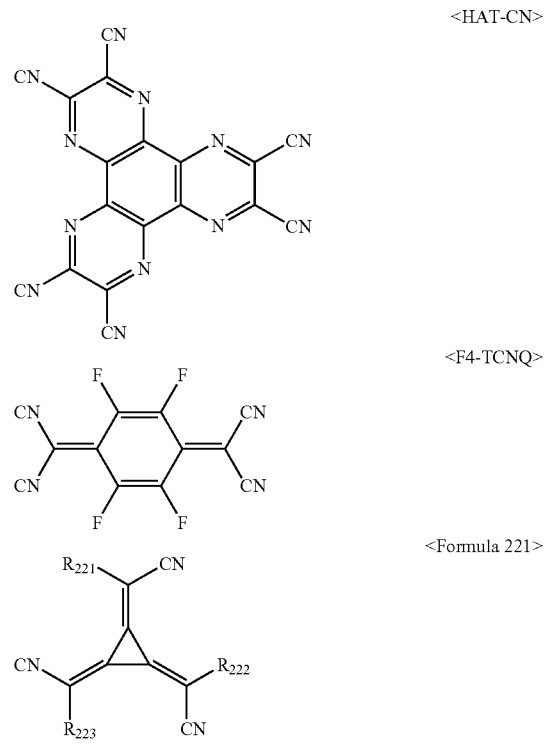

In Formula 221,

R$_{221}$ to R$_{223}$ may each independently be selected from a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_1$-C$_{60}$ heteroaryl group, a substituted or unsubstituted monovalent non-aromatic condensed polycyclic group, and a substituted or unsubstituted monovalent non-aromatic condensed heteropolycyclic group, and at least one selected from R$_{221}$ to R$_{223}$ may have at least one substituent selected from a cyano group, —F, —Cl, —Br, —I, a C$_1$-C$_{20}$ alkyl group substituted with —F, a C$_1$-C$_{20}$ alkyl group substituted with —Cl, a C$_1$-C$_{20}$ alkyl group substituted with —Br, and a C$_1$-C$_{20}$ alkyl group substituted with —I.

[Emission Layer in Interlayer 150]

When the light-emitting device is a full-color light-emitting device, the emission layer may be patterned into a red emission layer, a green emission layer, or a blue emission layer, according to a subpixel. In embodiments, the emission layer may have a stacked structure of two or more layers selected from a red emission layer, a green emission layer, and a blue emission layer, in which the two or more layers contact each other or are separated from each other. In embodiments, the emission layer may include two or more materials selected from a red light-emitting material, a green light-emitting material, and a blue light-emitting material, in which the two or more materials are mixed with each other in a single layer to emit white light.

The emission layer may include a first material, a second material, and a third material.

The first material may act as an inorganic host in the emission layer. In an embodiment, the first material itself does not emit light, but the first material may substantially transfer excitons to the third material to help the third material emit light.

The second material may act as a sensitizer in the emission layer. In an embodiment, the second material may enable rapid reverse transition from the triplet exciton to the singlet exciton and transfer the singlet exciton to the third material. Accordingly, substantially all triplet excitons and singlet excitons may be delivered to the third material. For example, the efficiency and/or lifespan of the light-emitting device may be improved due to the second material.

The third material may act as a light-emitting dopant.

The first material may include an inorganic semiconductor compound, an inorganic insulator compound, or any combination thereof.

For example, the first material may include an alkali metal halide, an alkaline earth metal halide, a lanthanide metal halide, a transition metal halide, a post-transition metal halide, a tellurium, a lanthanide metal telluride, a transition metal telluride, a post-transition metal telluride, a lanthanide metal selenide, a transition metal selenide, a post-transition metal selenide, or any combination thereof.

In an embodiment, the first material may include NaI, KI, RbI, CsI, NaCl, KCl, RbCl, CsCl, NaBr, KBr, RbBr, CsBr, MgI$_2$, CaI$_2$, SrI$_2$, BaI$_2$, MgCl$_2$, CaCl$_2$), SrCl$_2$, BaCl$_2$, MgBr$_2$, CaBr$_2$, SrBr$_2$, BaBr$_2$, EuI$_3$, YbI$_3$, SmI$_3$, TmI$_3$, EuI$_2$, YbI$_2$, SmI$_2$, TmI$_2$, EuCl$_3$, YbCl$_3$, SmCl$_3$, TmCl$_3$, EuBr$_3$, YbBr$_3$, SmBr$_3$, TmBr$_3$, AgI, CuI, NiI$_2$, CoI$_2$, BiI$_3$, PbI$_2$, SnI$_2$, Te, EuTe, YbTe, SmTe, TmTe, EuSe, YbSe, SmSe, TmSe, ZnTe, CoTe, ZnSe, CoSe, Bi$_2$Te$_3$, Bi$_2$Se$_3$, or any combination thereof.

In an embodiment, the first material may include KI, RbI, CsI, CuI, or any combination thereof, but embodiments are not limited thereto.

For example, the second material may include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or any combination thereof.

In an embodiment, the second material may include Yb, Tm, Sm, Eu, Er or any combination thereof, but embodiments are not limited thereto.

For example, the third material may include an organic fluorescent dopant compound, an organometallic phosphorescent dopant compound, an organic delayed fluorescence dopant compound, or any combination thereof.

The organic fluorescent dopant compound may be an organic compound that may emit fluorescent light, and may include an arylamine compound or a styrylamine compound.

In an embodiment, the organic fluorescent dopant compound may include a compound represented by Formula 501:

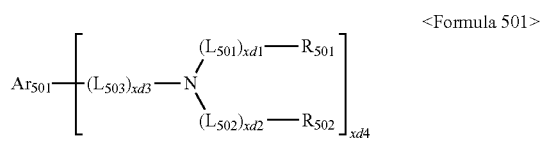

<Formula 501>

In Formula 501,

Ar$_{501}$ may be a substituted or unsubstituted C$_5$-C$_{60}$ carbocyclic group or a substituted or unsubstituted C$_1$-C$_{60}$ heterocyclic group, L$_{501}$ to L$_{503}$ may each independently be selected from a substituted or unsubstituted C$_3$-C$_{10}$ cycloalkylene group, a substituted or unsubstituted C$_1$-C$_{10}$ heterocycloalkylene group, a substituted or unsubstituted C$_3$-C$_{10}$ cycloalkenylene group, a substituted or unsubstituted C$_1$-C$_{10}$ heterocycloalkenylene group, a substituted or unsubstituted C$_6$-C$_{60}$ arylene group, a substituted or unsubstituted C$_1$-C$_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, R$_{501}$ and R$_{502}$ may each independently be selected from a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In an embodiment, Ar$_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In embodiments, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), wherein $Q_{31}$ to $Q_{33}$ may be selected from a $C_1$-$C_{10}$ alkyl group, a $C_1$-$C_{10}$ alkoxy group, a phenyl group, a biphenyl group, a terphenyl group, and a naphthyl group.

In embodiments, xd4 in Formula 501 may be 2, but embodiments are not limited thereto.

For example, the organic fluorescent dopant compound may be selected from compounds FD1 to FD22:

FD1
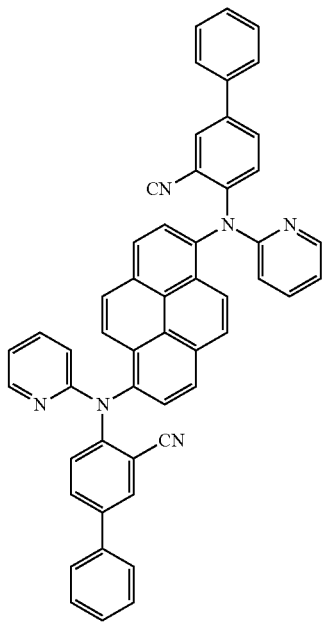
FD4
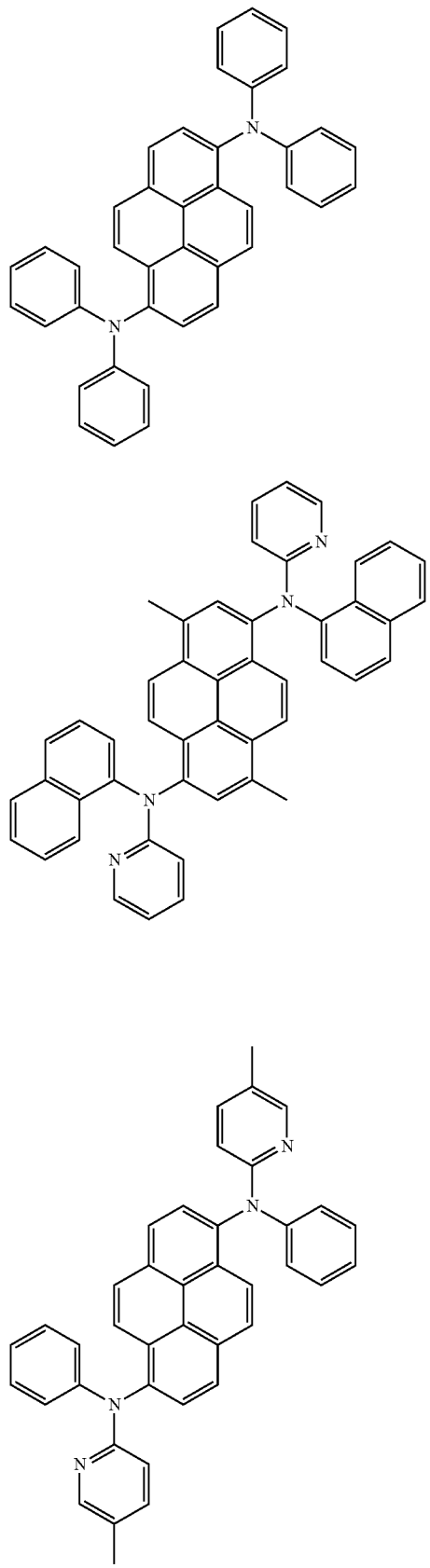
FD2
FD5
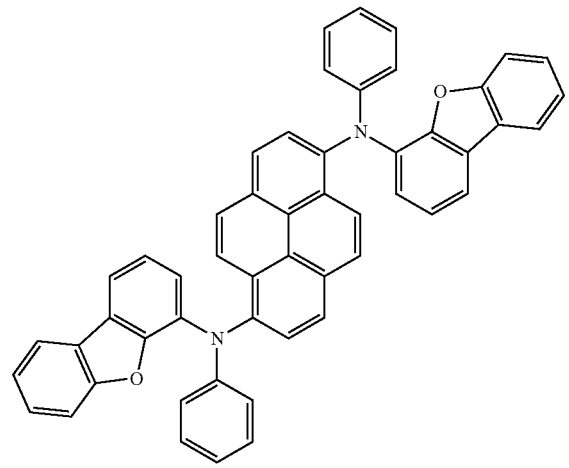
FD3
FD6
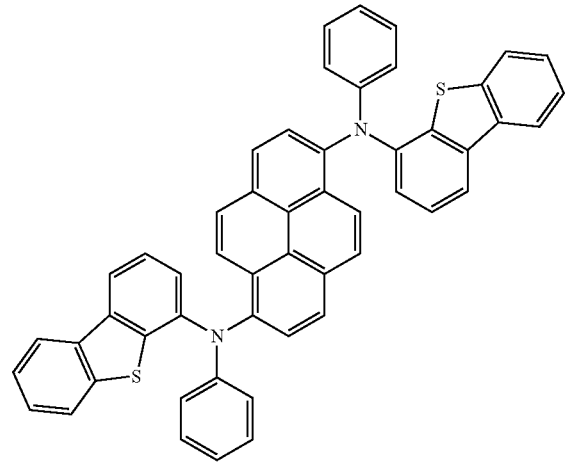

FD7
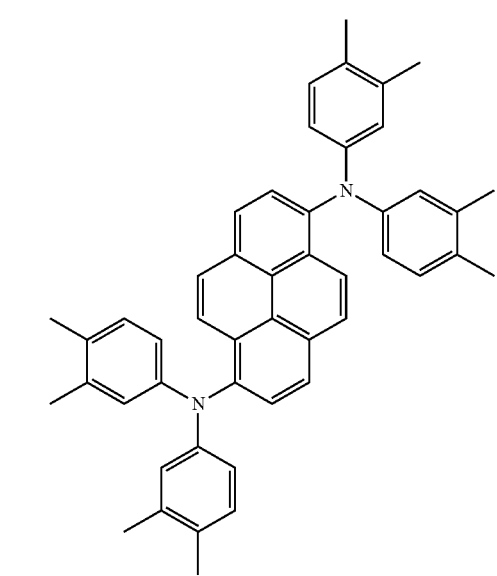
FD8
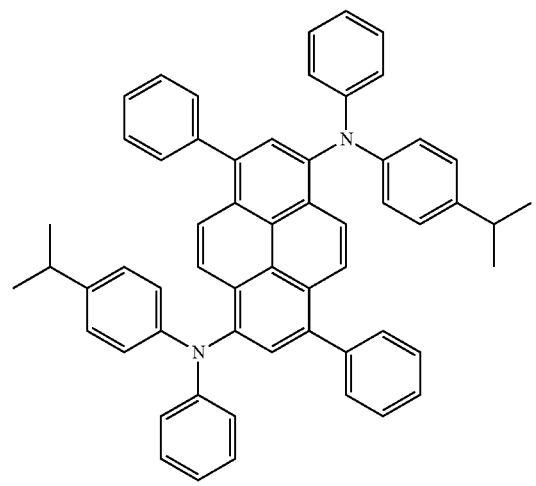
FD9
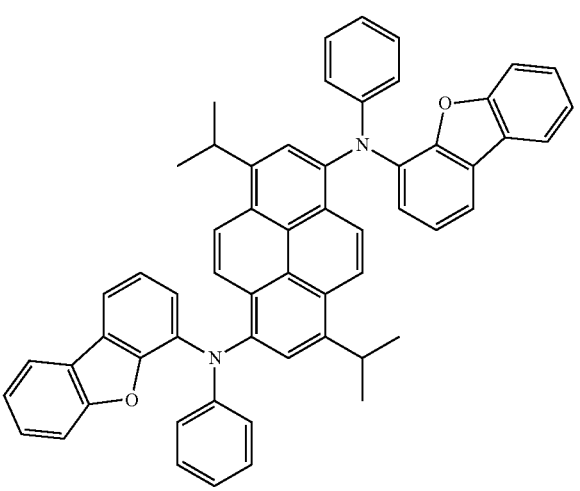
FD10
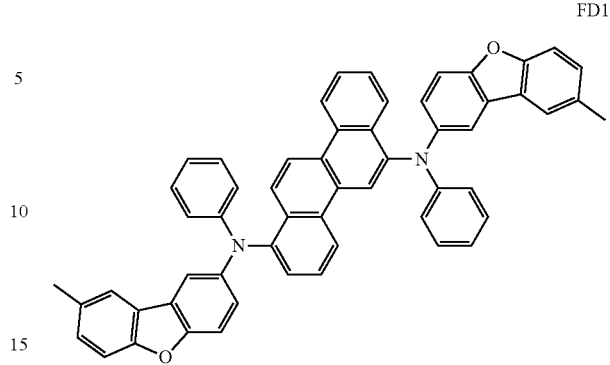
FD11
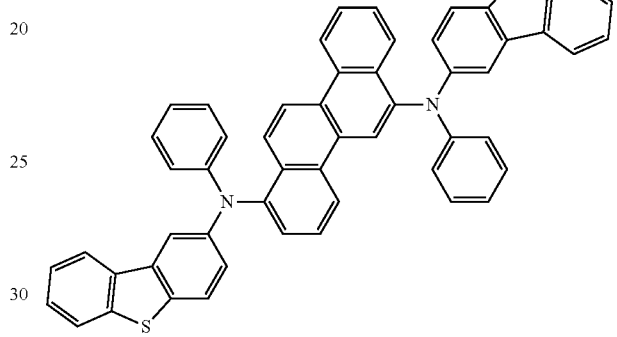
FD12
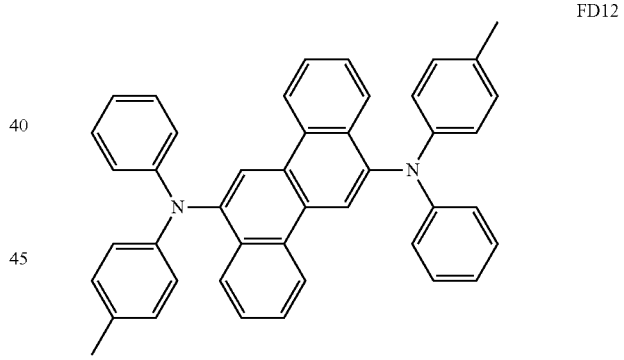
FD13
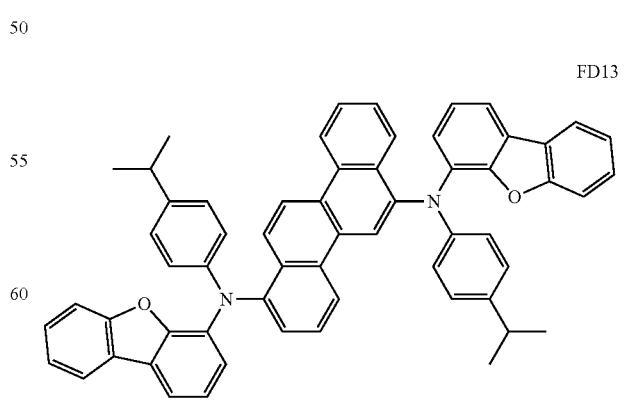

FD14
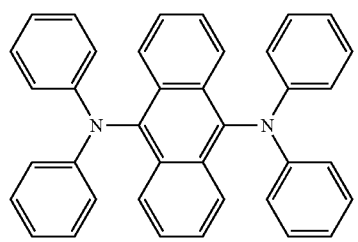
FD15
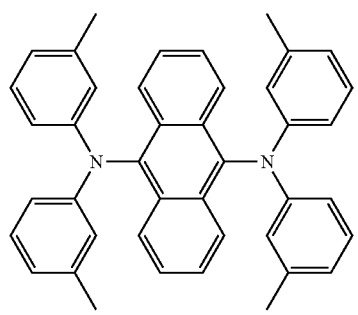
FD16
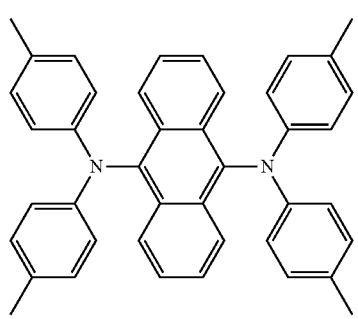
FD17
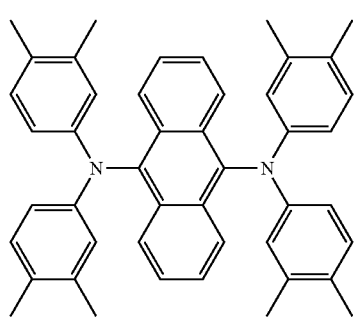
FD18
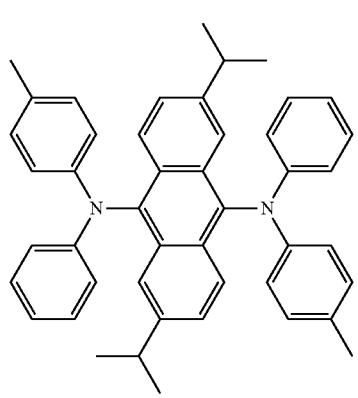
FD19
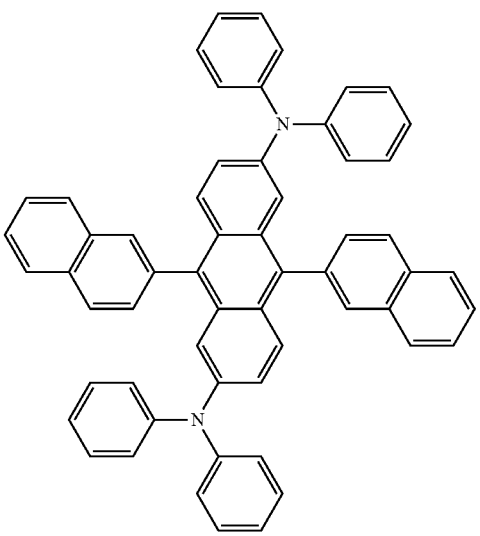
FD20
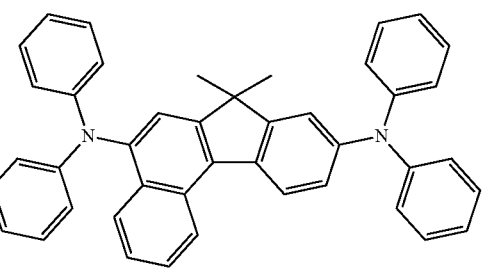
FD21
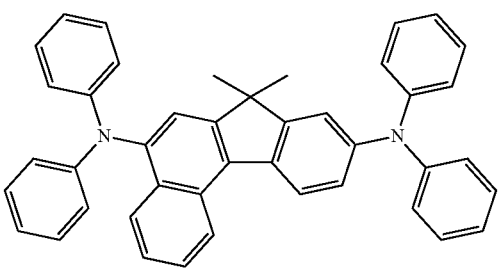
FD22
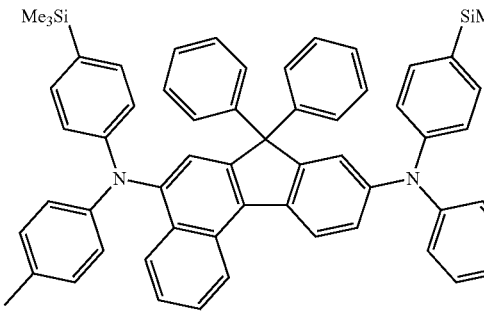
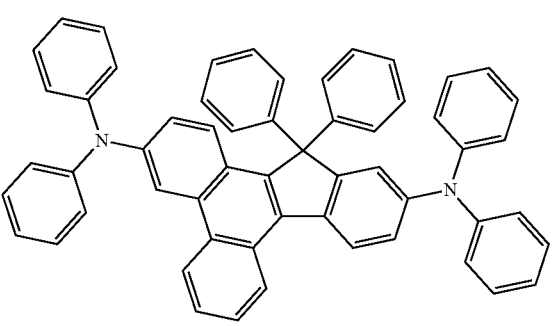
In embodiments, the organic fluorescent dopant compound may be selected from the following compounds, but embodiments are not limited thereto.

DPVBi
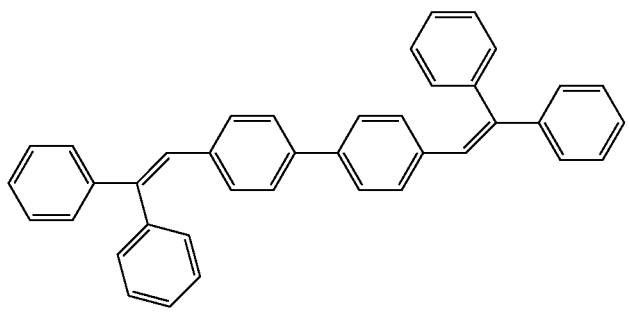
DPAVBi
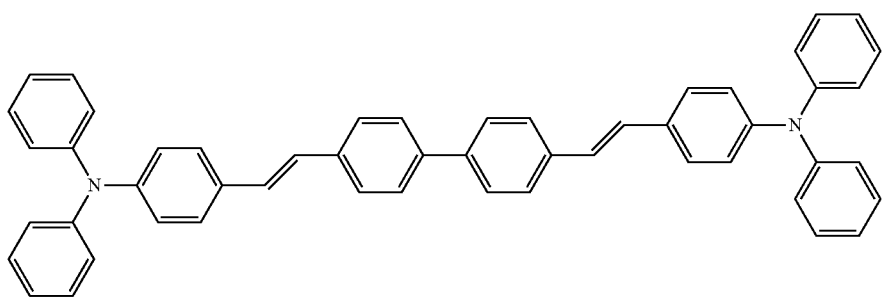
TBPe
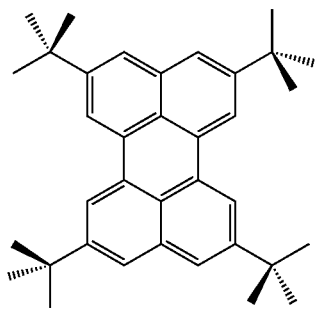
DCM
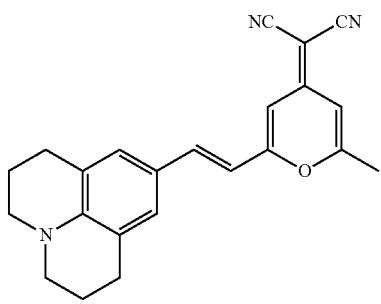
DCJTB
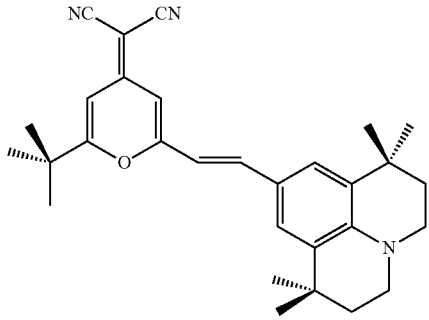
Coumarin 6
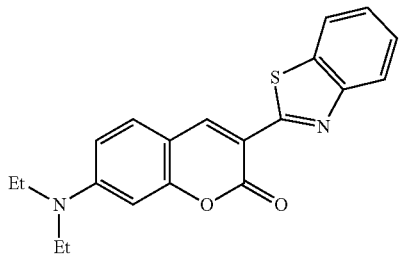
C545T
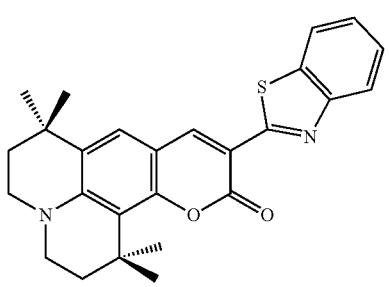
The organic delayed fluorescence dopant compound refers to an organic compound capable of emitting only delayed fluorescent light or simultaneously emitting delayed fluorescent light and fluorescent light.

In an embodiment, the organic delayed fluorescence dopant compound may include a compound represented by Formula 502:

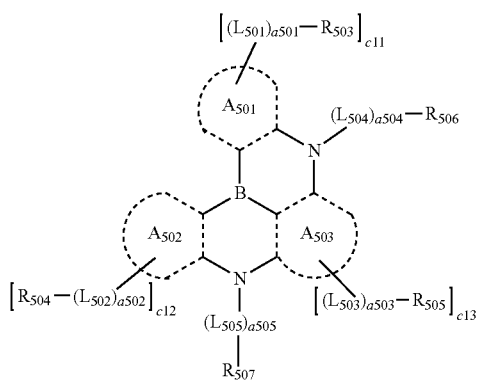

<Formula 502>

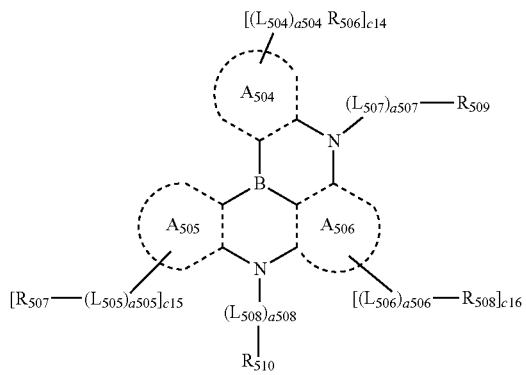

<Formula 503> wherein, in Formula 502,
$A_{501}$ to $A_{502}$ may each independently be a $C_5$-$C_{60}$ carbocyclic group or a $C_1$-$C_{60}$ heterocyclic group,
$L_{501}$ to $L_{505}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group,
a501 to a505 may each independently be an integer from 0 to 3,
$R_{503}$ to $R_{507}$ may each independently be selected from a substituted or unsubstituted $C_3$-$C_{10}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and
c11 to c13 may each independently be an integer from 0 to 6.

In an embodiment, $A_{501}$ to $A_{503}$ in Formula 502 may each independently be selected from a benzene group, a naphthalene group, a heptalene group, a fluorene group, a spirobifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, an indeno phenanthrene group, and a group represented by Formula 503:

wherein, in Formula 503,
$A_{504}$ to $A_{506}$ are the same as described in connection with $A_{501}$ in Formula 502,
$L_{504}$ to $L_{508}$ are the same as described in connection with $L_{501}$ in Formula 502,
a504 to a508 are the same as described in connection with a501 in Formula 502,
$R_{506}$ to $R_{510}$ are the same as described in connection with $R_{503}$ in Formula 502, and
c14 to c16 are the same as described in connection with c11 in Formula 502.

In embodiments, $L_{501}$ to $L_{505}$ in Formula 502 are the same as described above.

In embodiments, $R_{503}$ to $R_{507}$ in Formula 502 may each independently be selected from:
a methyl group, an ethyl group, an n-propyl group, an iso-propyl group, an n-butyl group, an iso-butyl group, a sec-butyl group, a tert-butyl group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a methyl group, an ethyl group, an n-propyl group, an iso-propyl group, an n-butyl group, an isobutyl group, a sec-butyl group, a tert-butyl group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and $-Si(Q_{31})(Q_{32})(Q_{33})$, wherein $Q_{31}$ to $Q_{33}$ may be selected from a $C_1$-$C_{10}$ alkyl group, a $C_1$-$C_{10}$ alkoxy group, a phenyl group, a biphenyl group, a terphenyl group, and a naphthyl group.

In an embodiment, c11 to c13 in Formula 502 may be 0 or 1, but embodiments are not limited thereto.

For example, the delayed fluorescence dopant compound may be selected from Compounds FD23 to FD25 below:

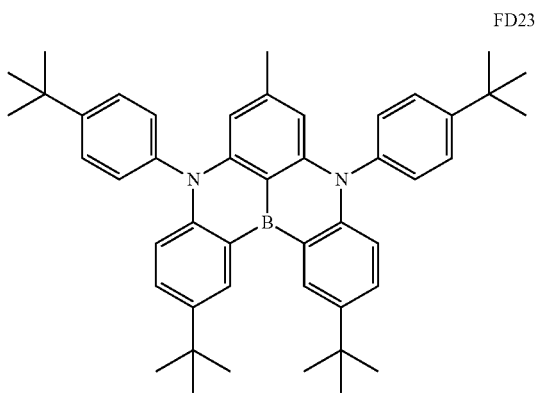

FD23

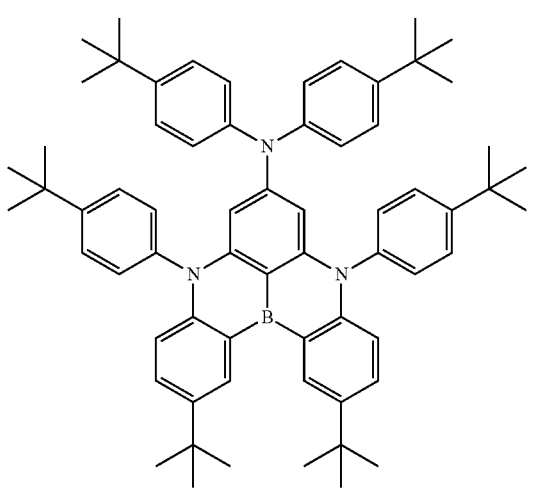

FD24

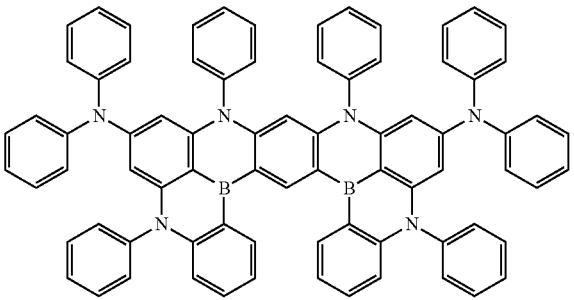

FD25

The organometallic phosphorescent dopant compound refers to an organic compound that may emit phosphorescent light.

In an embodiment, the organometallic phosphorescent dopant compound may be represented by Formula 401:

$$M(L_{401})_{xc1}(L_{402})_{xc2}$$ <Formula 401>

<Formula 402>

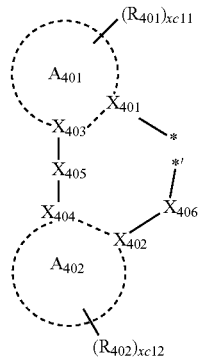

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be a ligand represented by Formula 402, and xc1 may be 1, 2, or 3, wherein when xc1 is two or more, two or more $L_{401}$(s) may be identical to or different from each other, $L_{402}$ may be an organic ligand, and xc2 may be an integer from 0 to 4, wherein when xc2 may be two or more, two or more $L_{402}$(s) may be identical to or different from each other, $X_{401}$ to $X_{404}$ may each independently be nitrogen or carbon, $X_{401}$ and $X_{403}$ may be linked via a single bond or a double bond, and $X_{402}$ and $X_{404}$ may be linked via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)—*', wherein $Q_{411}$ and $Q_{412}$ may be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 3, and

* and *' in Formula 402 each indicate a binding site to M in Formula 401.

In an embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In embodiments, in Formula 402, i) $X_{401}$ may be nitrogen and $X_{402}$ may be carbon, or ii) $X_{401}$ and $X_{402}$ may each be nitrogen at the same time.

In embodiments, $R_{401}$ and $R_{402}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments are not limited thereto.

In embodiments, when xc1 in Formula 401 is 2 or more, two $A_{401}$(s) in two or more $L_{401}$(s) may optionally be linked to each other via $X_{407}$, which is a linking group, two $A_{402}$(s) may optionally be linked to each other via $X_{408}$, which is a linking group (see Compounds PD1 to PD4 and PD7 below). $X_{407}$ and $X_{408}$ may each independently be a single bond, *—O—*', *—S—*', *—C(=O)—*', *—N($Q_{413}$)-*', *—C($Q_{413}$)($Q_{414}$)-*', or *—C($Q_{413}$)=C($Q_{414}$)-*' (where $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments are not limited thereto.

$L_{402}$ in Formula 401 may be a monovalent, divalent, or trivalent organic ligand. For example, $L_{402}$ may be selected from halogen, diketone (for example, acetylacetonate), carboxylic acid (for example, picolinate), —C(=O), isonitrile, —CN, and phosphorus (for example, phosphine, or phosphite), but embodiments are not limited thereto.

In embodiments, the organometallic phosphorescent dopant may be selected from, for example, Compounds PD1 to PD25 below, but embodiments are not limited thereto:

PD1

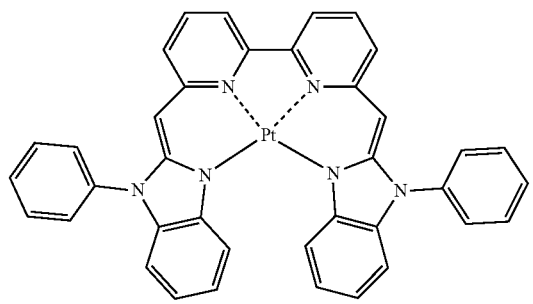

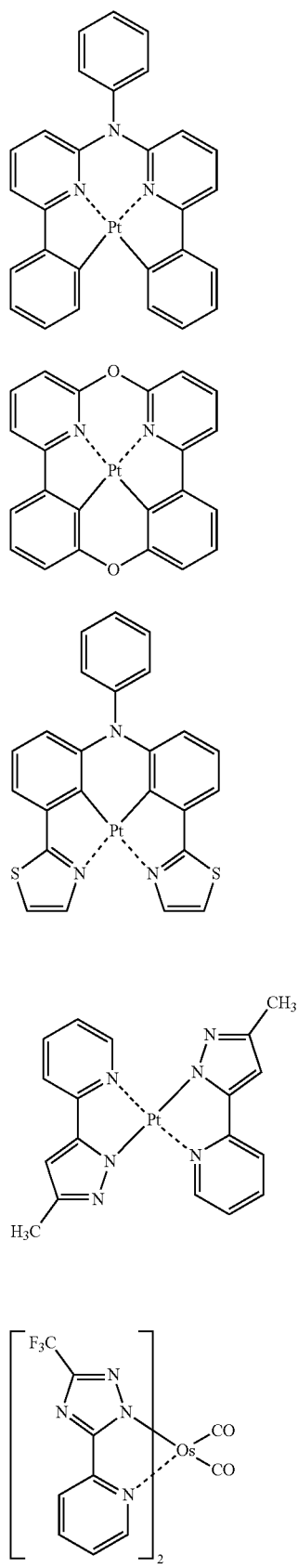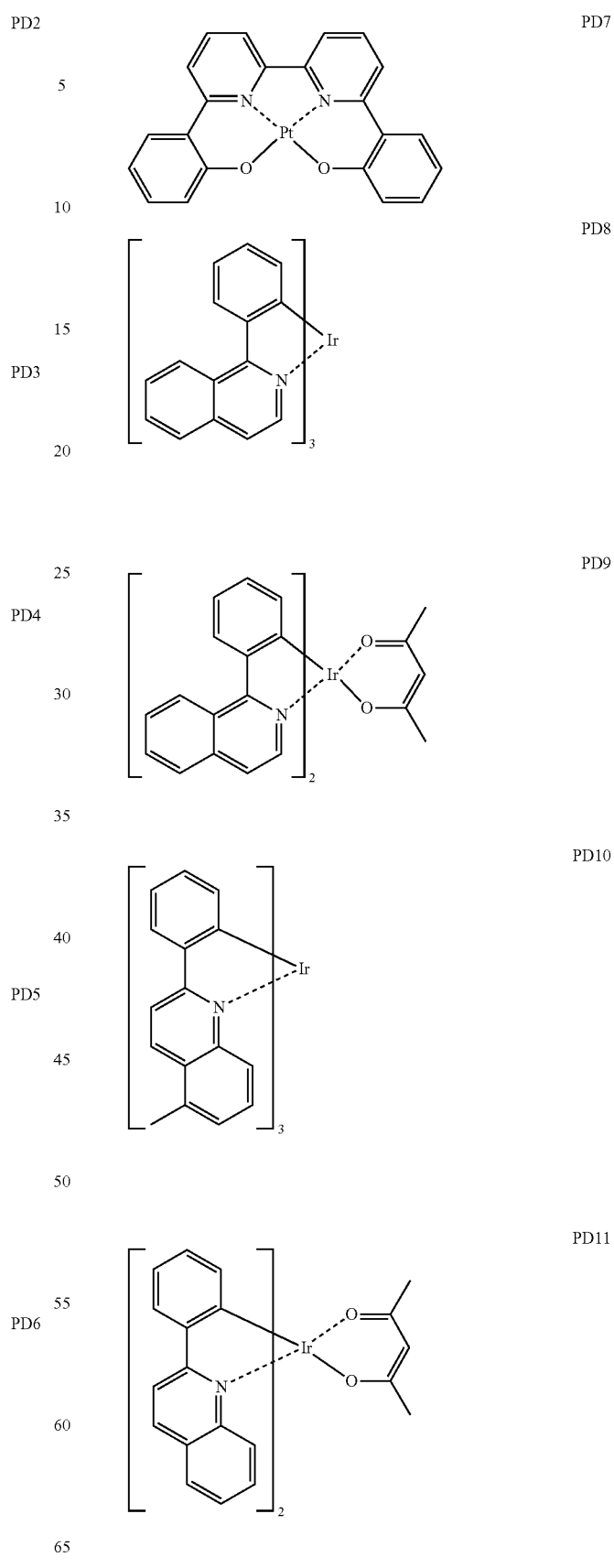

-continued
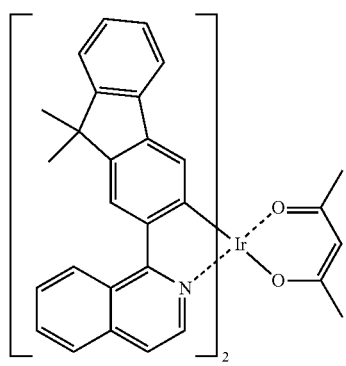
PD12
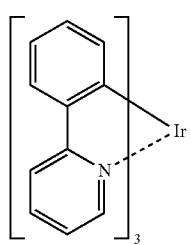
PD13
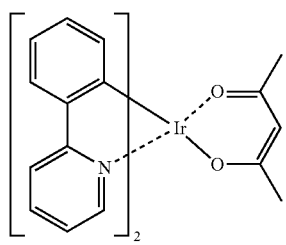
PD14
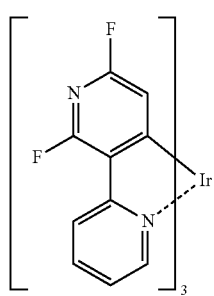
PD15
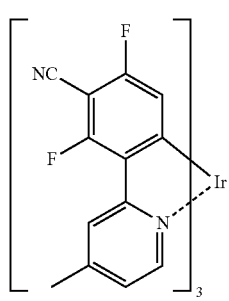
PD16
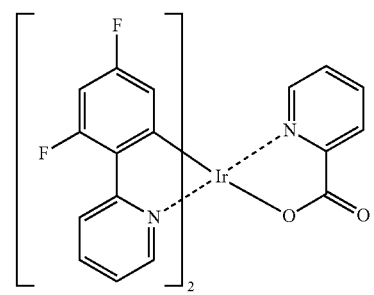
PD17
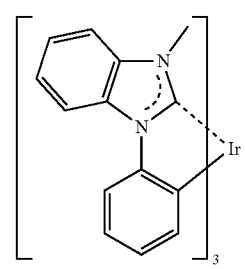
PD18
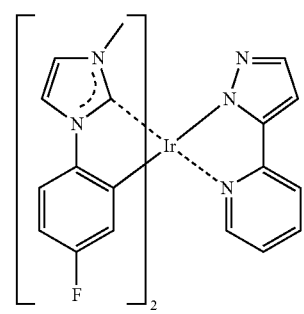
PD19
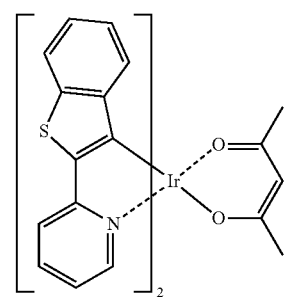
PD20
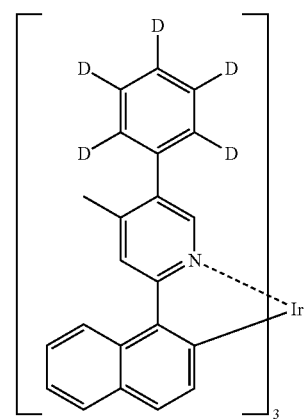
PD21

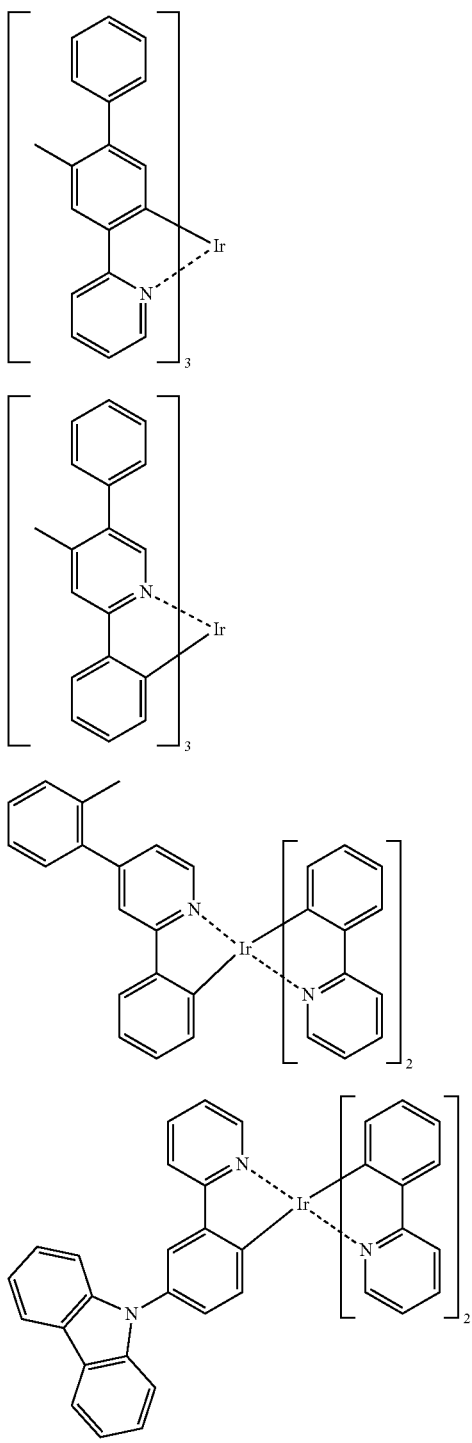

The volume of the first material may be greater than or equal to the volume of the second material. In an embodiment, the volume ratio of the first material to the second material may be in a range of about 99:1 to about 50:50, but embodiments are not limited thereto. Within the above-described range, the second material may form an energy level which is selective with respect to the first material and thus, may act as a sensitizer sufficiently.

The volume of the third material in the emission layer may be in a range of about 1% to about 15%, but embodi- ments are not limited thereto. Within the above-mentioned range, the third material may sufficiently act as a light-emitting dopant.

A thickness of the emission layer may be in a range of about 0.1 nm to about 100 nm. For example, the thickness of the emission layer may be in a range of about 15 nm to about 50 nm. For example, when the emission layer emits blue light, a thickness of the blue emission layer may be in a range of about 15 nm to about 20 nm. For example, when the emission layer emits green light, a thickness of the green emission layer may be in a range of about 20 nm to about 40 nm. For example, when the emission layer emits red light, a thickness of the red emission layer may be in a range of about 40 nm to about 50 nm. When the thickness of the emission layer is within these ranges, the light-emitting device 1 may have excellent light-emission characteristics without a substantial increase in driving voltage.

[Electron Transport Region in Middle Layer 150]

The electron transport region may have i) a single-layered structure including a single layer including a single material, ii) a single-layered structure including a single layer includ- ing different materials, or iii) a multi-layered structure having multiple layers including different materials.

The electron transport region may include a hole blocking layer, an electron transport layer, an electron injection layer, or any combination thereof, but embodiments are not limited thereto.

[Electron Injection Layer in Electron Transport Region]

The light-emitting device may include an electron injec- tion layer in contact (e.g., direct contact) with the second electrode.

The electron injection layer may include a sixth material, and the sixth material may include an alkali metal halide, an alkaline earth metal halide, a lanthanide metal halide, or any combination thereof.

In an embodiment, the electron injection layer may con- sist of a sixth material. For example, the electron injection layer may not include any material other than the sixth material.

In embodiments, the electron injection layer may further include a seventh material, and the sixth material and the seventh material may be different from each other. The seventh material may include an alkali metal, an alkaline earth metal, a lanthanide metal, or any combination thereof.

In an embodiment, the sixth material may be a compound having a wide band gap of about 7 eV or more. Accordingly, the sixth material may not substantially absorb light.

In an embodiment, the seventh material may be a com- pound having a low work function of about 2.6 eV or less.

In an embodiment, the sixth material may be represented by Formula X, and the seventh material may be represented by Formula Y:

$$A_nB_m \qquad \text{<Formula X>}$$

$$C \qquad \text{<Formula Y>}$$

In Formulae X and Y,

A and C may each independently include an alkali metal, an alkaline earth metal, a lanthanide metal, or any combination thereof, B may be a halogen, n and m may each independently be an integer of 1 or more that makes the sixth material neutral, and A and C may be different from each other.

When A and C are different from each other, the seventh material may complement light absorption according to a narrow band gap of the sixth material.

For example, in Formulae X and Y, A may include Li, Na, K, Rb, Cs, or any combination thereof, B may include F, Cl, Br, I, or any combination thereof, each of n and m is 1, and C may include La, Ce, Pr, Nd, Pm, Sm, Eu, Gd, Tb, Dy, Ho, Er, Tm, Yb, Lu, or any combination thereof.

In an embodiment, the sixth material may include NaI, KI, RbI, CsI, NaCl, KCl, RbCl, CsCl, NaF, KF, RbF, CsF, or any combination thereof, and the seventh material may include La, Ce, Pr, Nd, Pm, Sm, Eu, Gd, Tb, Dy, Ho, Er, Tm, Yb, Lu, or any combination thereof.

In the electron injection layer, the volume of the sixth material may be greater than or equal to the volume of the seventh material. In an embodiment, in the electron injection layer, the volume percentage of the seventh material may be greater than 0% and less than or equal to 50%. In an embodiment, in the electron injection layer, the volume percentage of the seventh material may be in a range of about 5% to about 10%, but embodiments are not limited thereto. When the volume of the seventh material is within the range above, the seventh material may be sufficient to complement light absorption according to a narrow band gap of the sixth material.

A thickness of the electron injection layer may be in a range of about 0.1 nm to about 5 nm. When the thickness of the electron injection layer is within the range above, satisfactory electron injection characteristics may be obtained without a substantial increase in driving voltage.

[Electron Transport Layer in Electron Transport Region]

The light-emitting device 1 may include an electron transport layer contacting (e.g., directly contacting) the emission layer.

The electron transport layer may include a tenth material and an eleventh material, and the tenth material and the eleventh material may be different from each other. The tenth material may include at least one electron transport organic compound, and the eleventh material may include an alkali metal halide, an alkaline earth metal halide, a lanthanide metal halide, or any combination thereof.

The term "electron transport organic compound" as used herein refers to a metal-free compound including at least one π electron-deficient nitrogen-containing ring.

The "π electron-depleted nitrogen-containing ring" indicates a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-deficient nitrogen-containing ring include an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, an isobenzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and an azacarbazole ring, but are not limited thereto.

The term "electron transport organic compound" as used herein may include a compound represented by Formula 601:

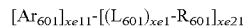  <Formula 601>

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of $Ar_{601}$(s) in the number of xe11 and $R_{601}$(s) in the number of xe21 may include the π electron-depleted nitrogen-containing ring.

In an embodiment, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more Ar$_{601}$(s) may be linked to each other via a single bond.

In embodiments, Ar$_{601}$ in Formula 601 may be an anthracene group.

In embodiments, a compound represented by Formula 601 may be represented by Formula 601-1 below:

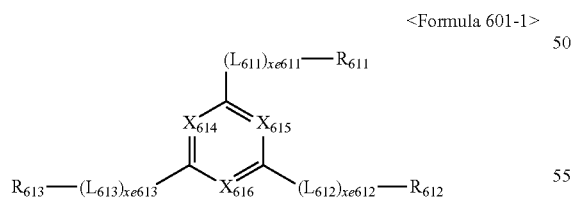

<Formula 601-1> wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments are not limited thereto.

In embodiments, xe1 and xe611 to xe613 in Formulae 601 and 601-1 may each independently be 0, 1, or 2.

In embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), wherein $Q_{601}$ and $Q_{602}$ are the same as described above.

The electron transport region may include at least one compound selected from Compounds ET1 to ET36, but embodiments are not limited thereto:

ET33
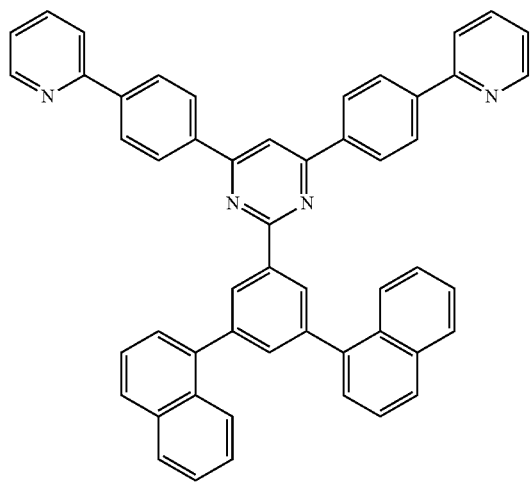
ET34
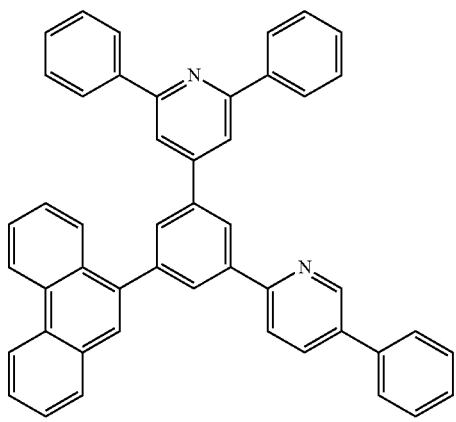
ET35
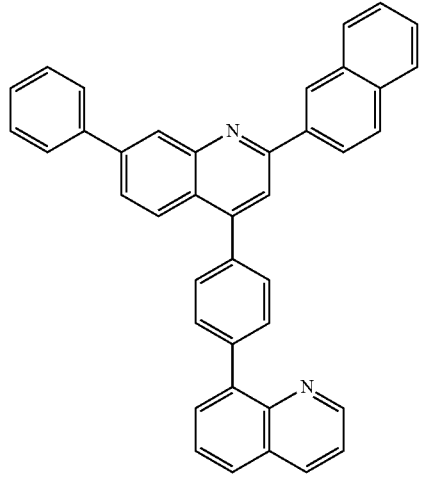
ET36
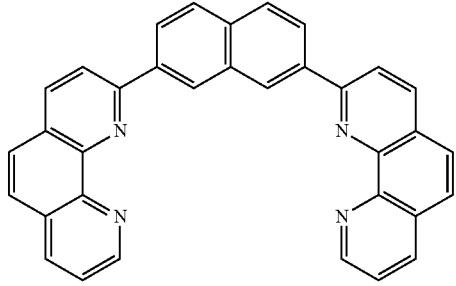
ET1
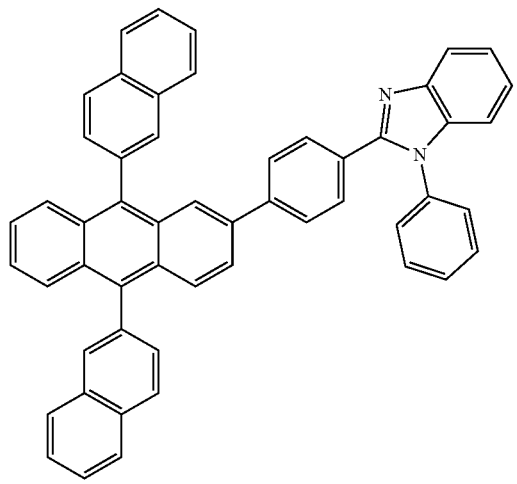

-continued
ET2
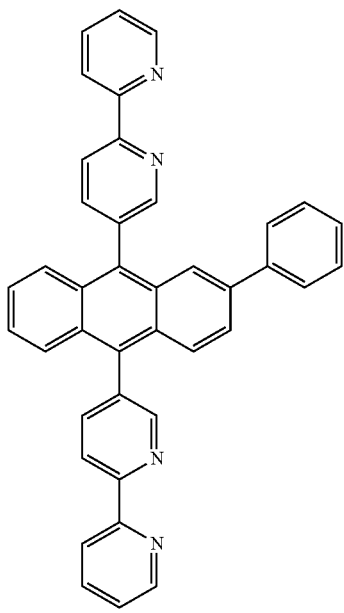
ET3
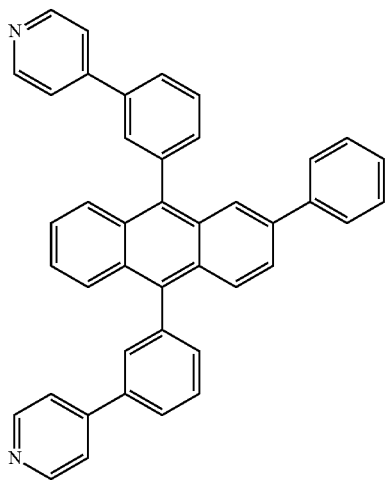
ET4
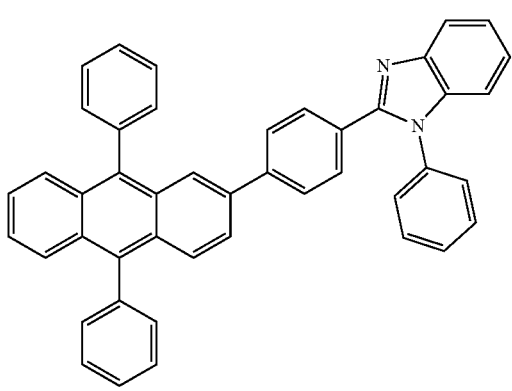

-continued
ET5
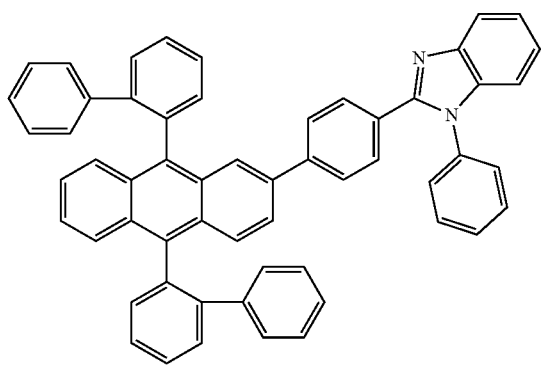
ET6
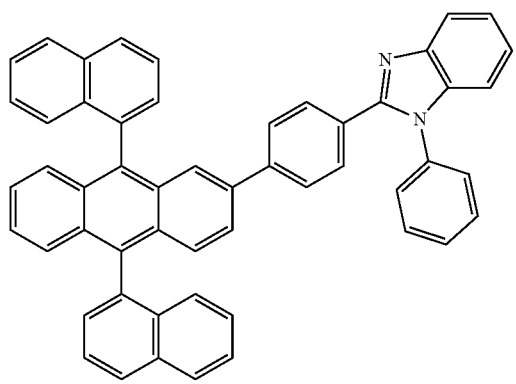
ET7
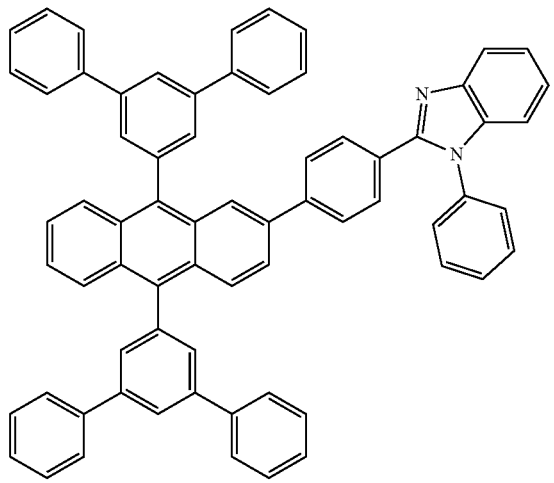

-continued
ET8
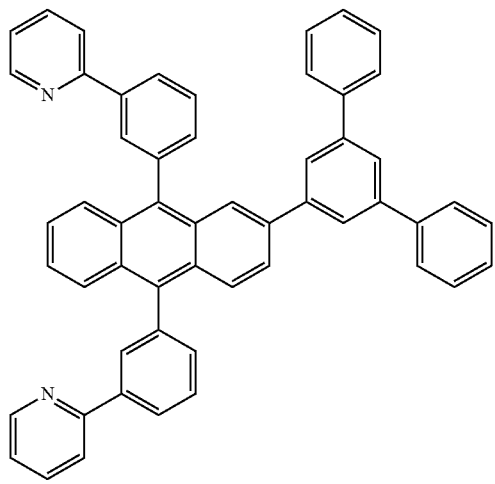
ET9
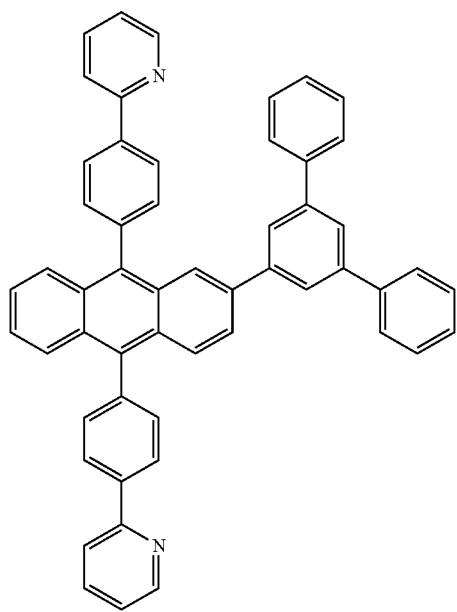

-continued
ET10
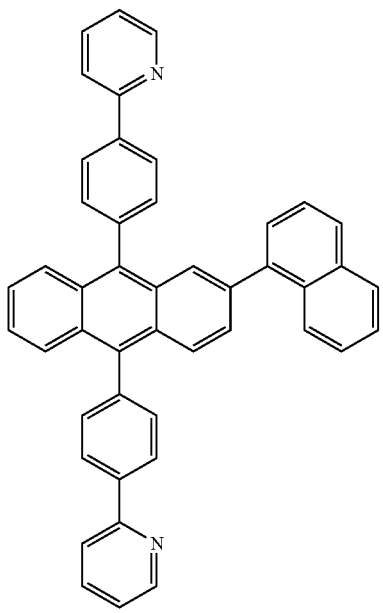
ET11
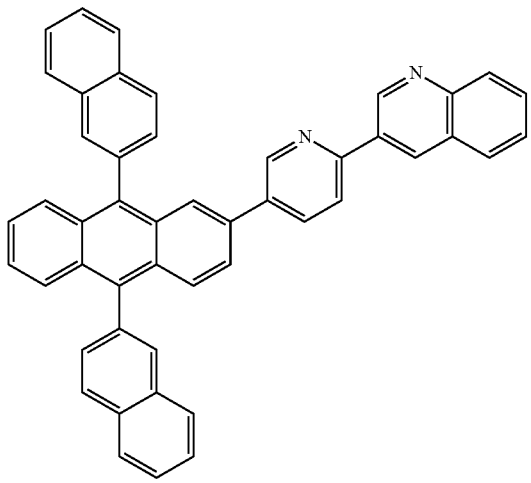
ET12
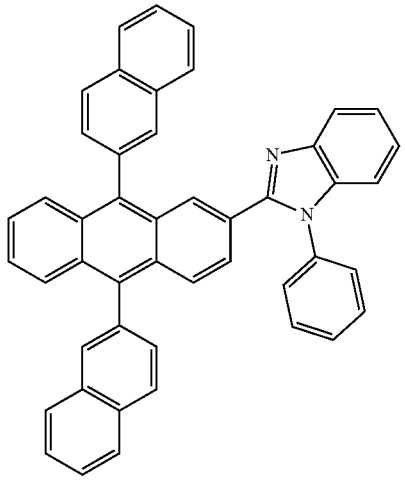

-continued
ET13
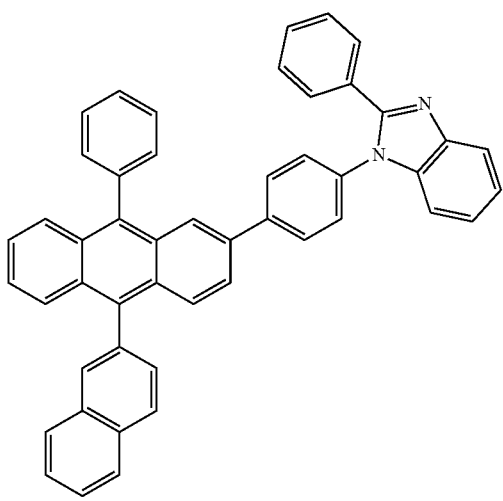
ET14
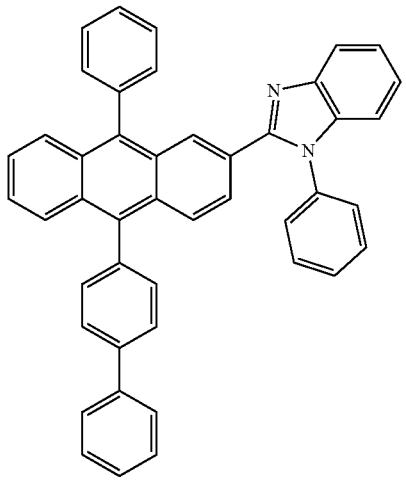
ET15
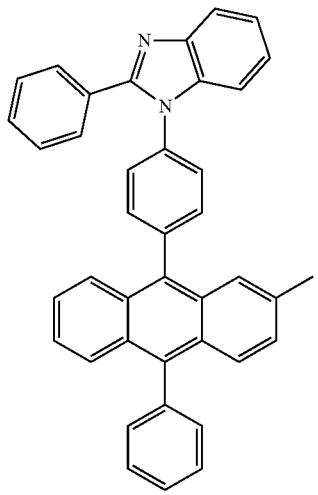

-continued
ET16
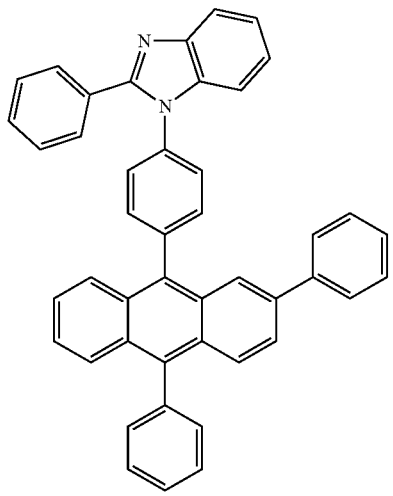
ET17
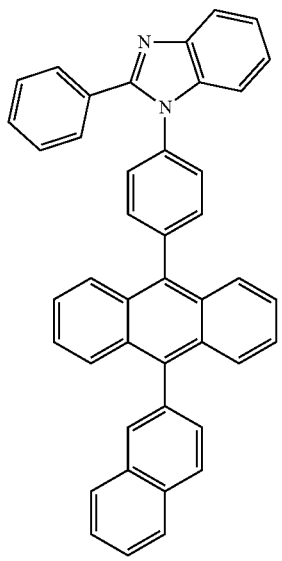
ET18
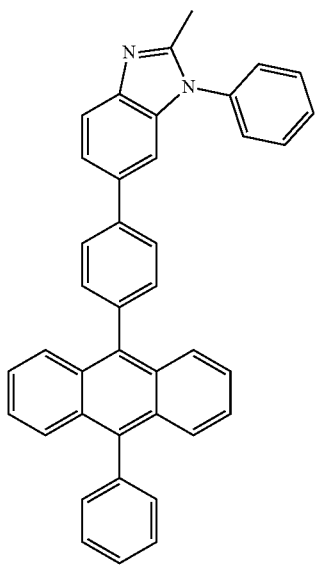

-continued
ET19
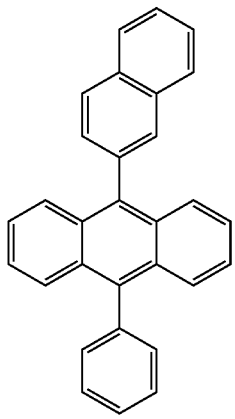
ET20
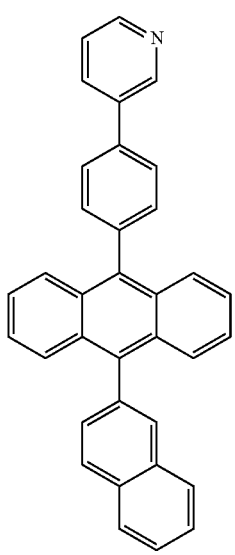
ET21
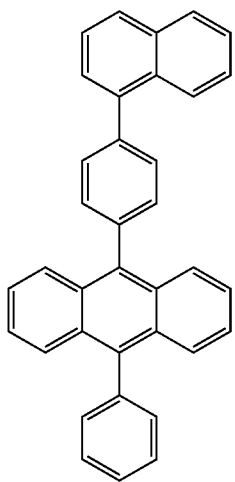

-continued
ET22
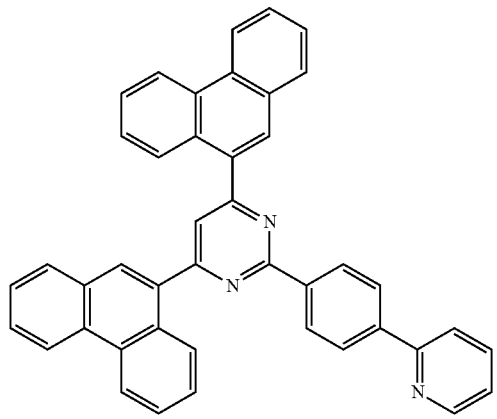
ET23
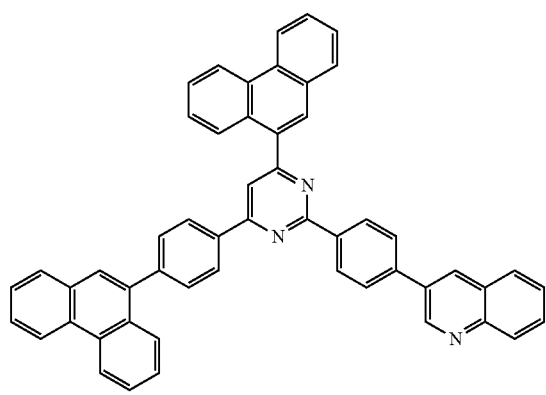
ET24
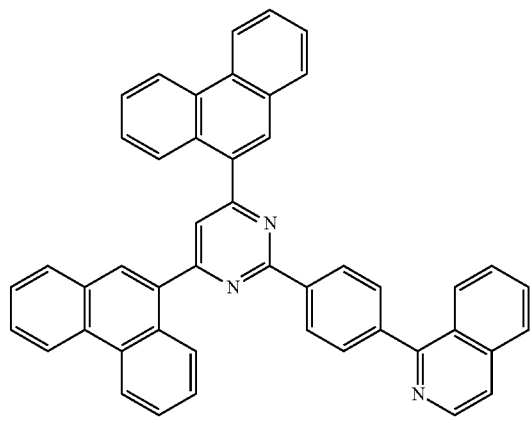

ET25
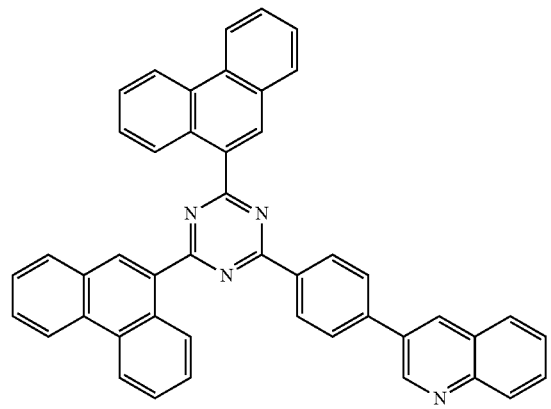
ET26
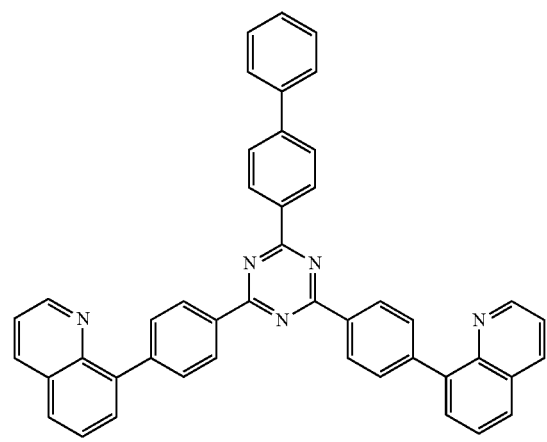
ET27
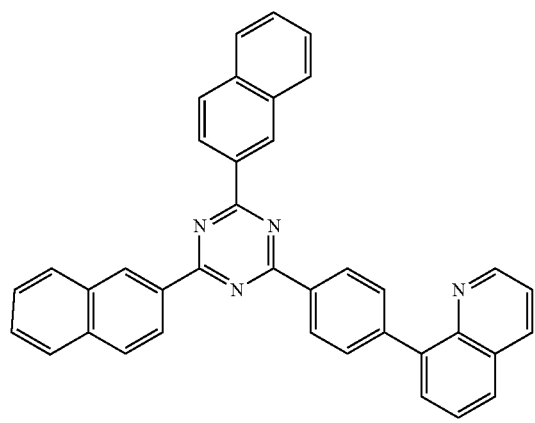

-continued
ET28
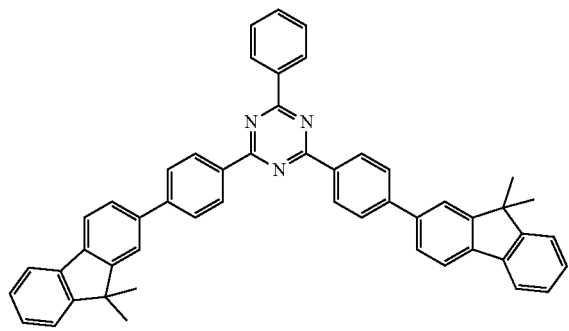
ET29
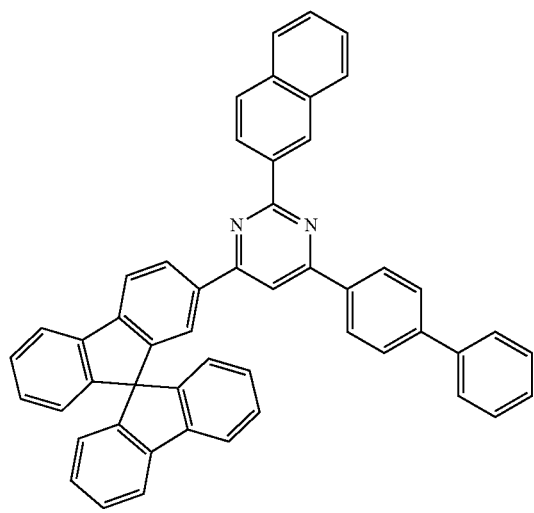
ET30
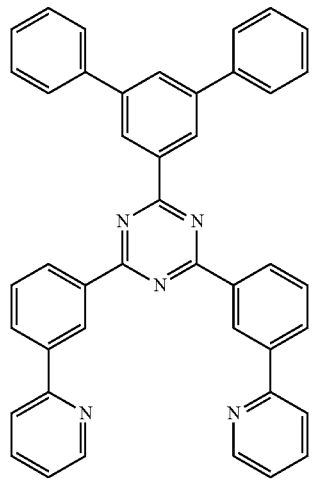

-continued
ET31
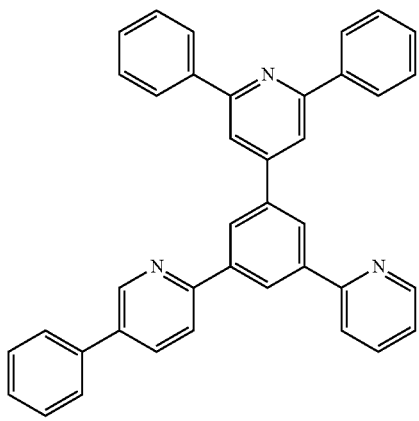
ET32
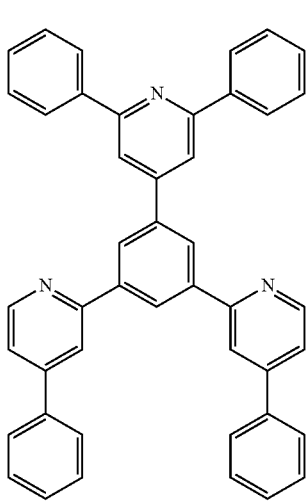
ET33
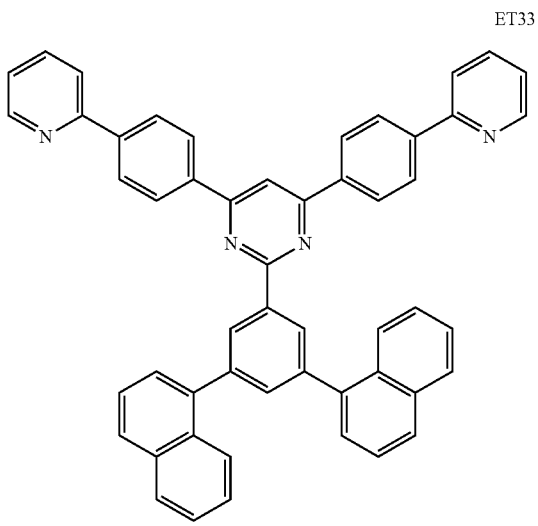

-continued
ET34
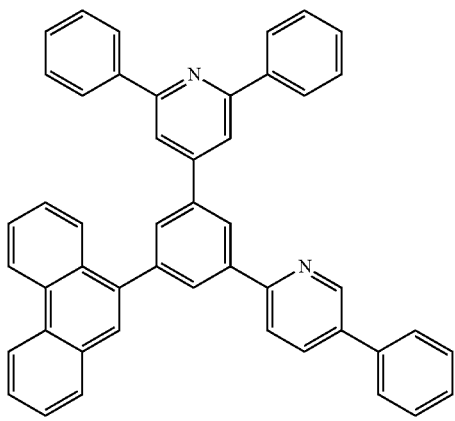
ET35
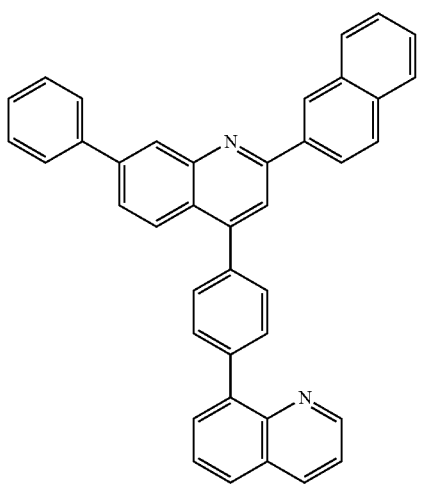
ET36
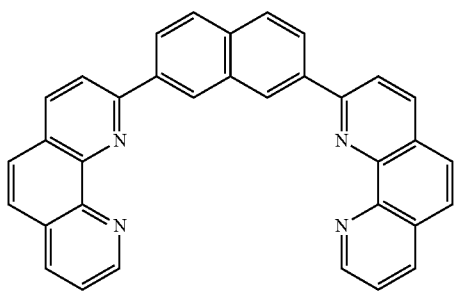

In embodiments, the electron transport region may include at least one selected from 2,9-dimethyl-4,7-diphenyl-1,10-phenanthroline (BCP), 4,7-dphenyl-1,10-phenanthroline (Bphen), Alq₃, BAlq, 3-(biphenyl-4-yl)-5-(4-tert-butylphenyl)-4-phenyl-4H-1,2,4-triazole (TAZ), and NTAZ:

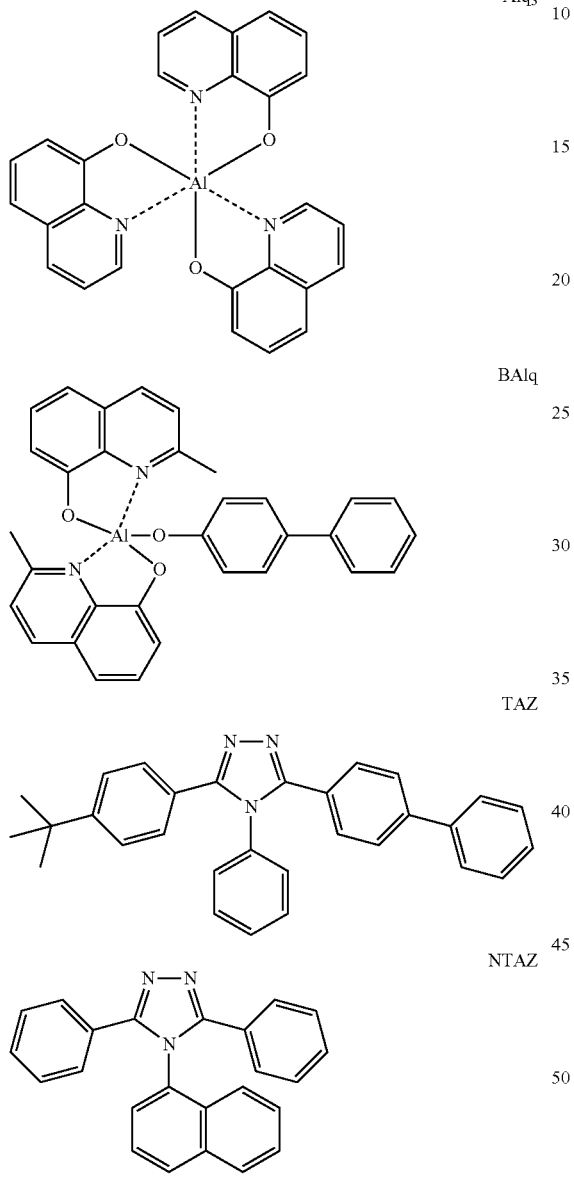

In the electron transport layer, a volume of the tenth material may be greater than or equal to a volume of the eleventh material. In an embodiment, in the electron transport layer, a volume ratio of the tenth material to the eleventh material may be in a range of about 99:1 to about 50:50.

A thickness of the electron transport layer may be in a range of about 0.1 nm to about 10 nm. When the thickness of the electron transport layer is within the range above, satisfactory electron transport characteristics may be obtained without a substantial increase in driving voltage.

[Metal-Containing Material in Electron Transport Region]

The electron transport region may further include, in addition to the materials described above, a metal-containing material.

The metal-containing material may include at least one selected from an alkali metal complex and an alkaline earth-metal complex.

A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments are not limited thereto.

For example, the metal-containing material may include a Li complex. The Li complex may include, for example, Compound ET-D1 (lithium quinolate, LiQ) or ET-D2:

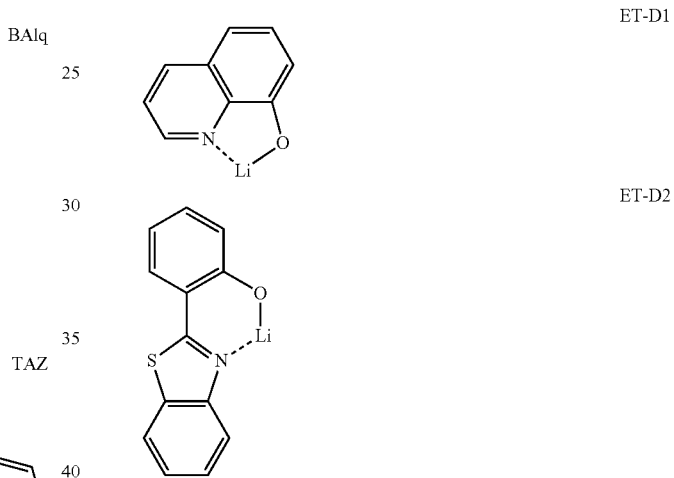

[Second Electrode 190]

The second electrode 190 may be located on the middle layer 150 having such a structure. The second electrode 190 may be a cathode which is an electron injection electrode, and in this regard, a material for forming the second electrode 190 may be selected from a metal, an alloy, an electrically conductive compound, and a combination thereof, which have a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments are not limited thereto. The second electrode 190 may be a transmissive electrode, a semi-transmissive electrode, or a reflective electrode.

The second electrode 190 may have a single-layered structure or a multi-layered structure including two or more layers.

A thickness of the second electrode 190 may be in a range of about 5 nm to about 20 nm. Within this range, light absorption at the second electrode may be minimized.

Figure 2:
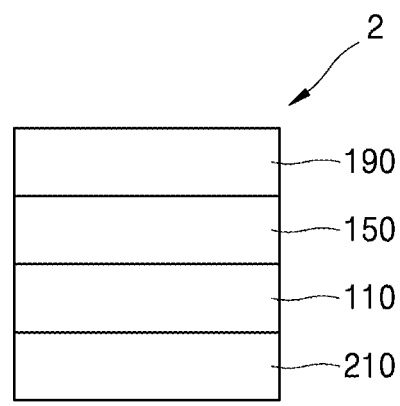
Figure 3:
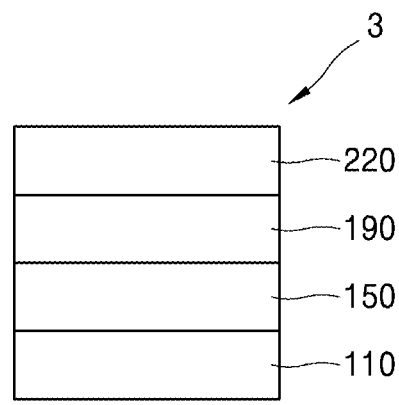
Figure 4:
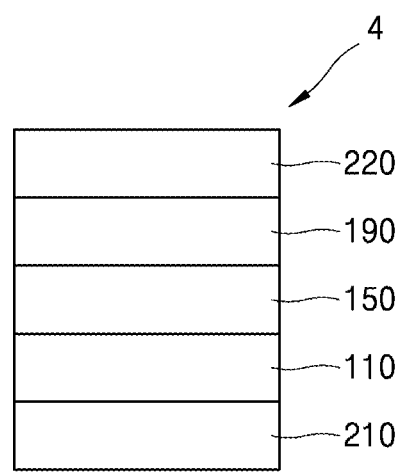

[Description of FIGS. 2 to 4]

The light-emitting device may further include a first capping layer and/or a second capping layer. In an embodiment, a first capping layer 210, an anode 110, an interlayer 150, and a cathode 190 may be sequentially stacked in this stated order (see FIG. 2), or the anode 110, the interlayer 150, the cathode 190, and a second capping layer 220 may be sequentially stacked in this stated order (see FIG. 3), and the first capping layer 210, the anode 110, the interlayer 150, the cathode 190, and the second capping layer 220 may be sequentially stacked in this stated order (see FIG. 4).

Light generated in an emission layer of an interlayer of a light-emitting device may be emitted through an anode, which is a semi-transmissive electrode or transmissive electrode, and a first capping layer, or light generated in the emission layer of the interlayer of the light-emitting device may be emitted through a cathode, which is a semi-transmissive electrode or transmissive electrode, and a second capping layer.

The first capping layer and the second capping layer may increase external luminescence efficiency according to the principle of constructive interference.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include at least one material selected from carbocyclic compounds, heterocyclic compounds, amine-based compounds, porphyrine derivatives, phthalocyanine derivatives, a naphthalocyanine derivatives, alkali metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I. In an embodiment, at least one of the first capping layer and the second capping layer may each independently include an amine-based compound.

In embodiments, at least one of the first capping layer and the second capping layer may each independently include a compound represented by Formula 201 or a compound represented by Formula 202.

In embodiments, at least one of the first capping layer and the second capping layer may each independently include a compound selected from Compounds HT28 to HT33 and Compounds CP1 to CP5, but embodiments are not limited thereto.

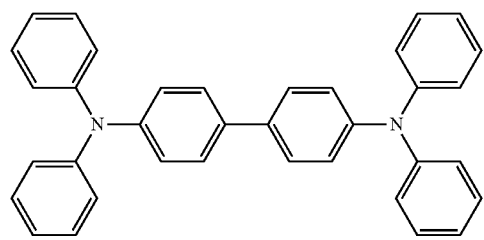

CP1

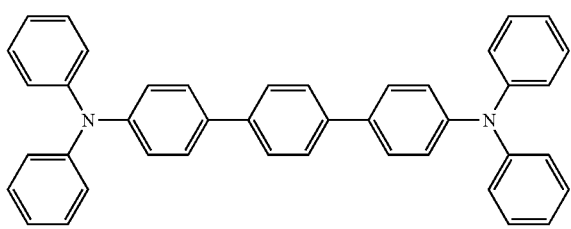

CP2

-continued

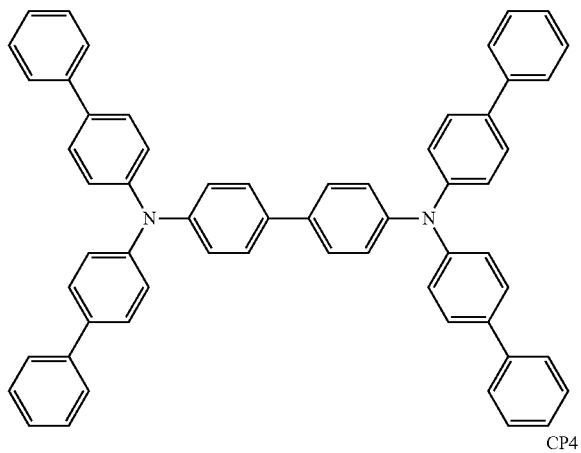

CP3

CP4

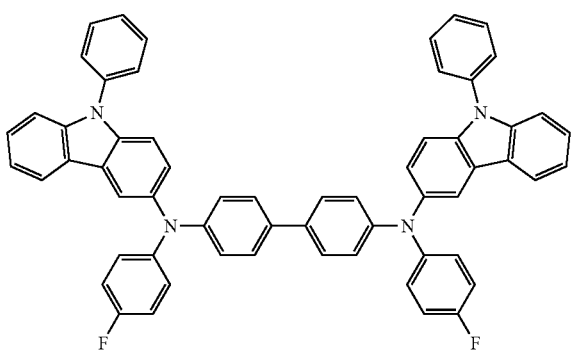

CP5

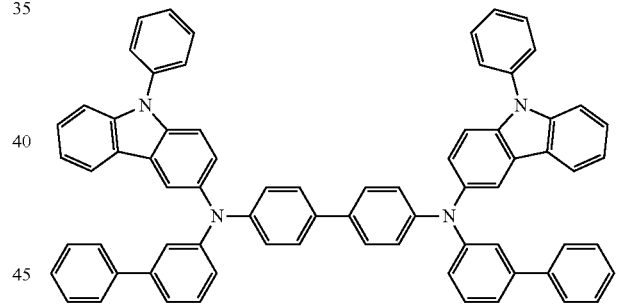

[Tandem Light-Emitting Device]

Figure 5:
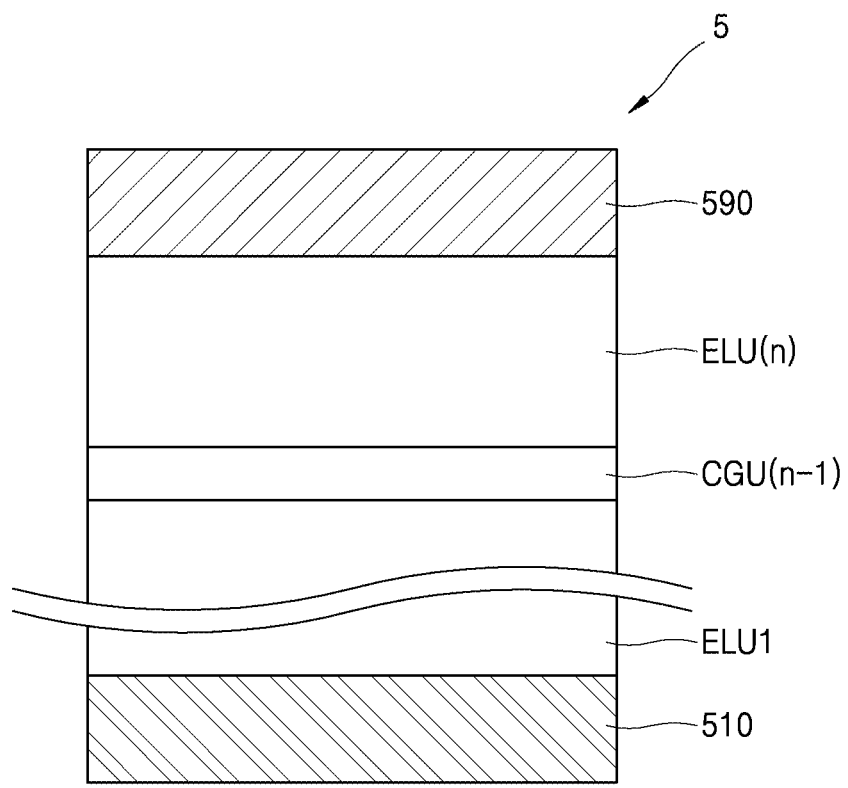
FIG. 5 shows a schematic cross-sectional view of a tandem light-emitting device according to an embodiment.

FIG. 5 is a schematic cross-sectional view of a light-emitting device 5 according to an embodiment.

Referring to FIG. 5, the light-emitting device 5 according to an embodiment may include: a first electrode 510; a second electrode 590 facing the first electrode; n light-emitting units ELU1 through ELU(n) located between the first electrode and the second electrode; and n−1 charge generating units CGU(n−1)(s) located between neighboring light-emitting units, wherein n is a natural number of 2 or more, and each of the light-emitting units may include an emission layer.

The n light-emitting units may emit different color of light or identical color of light.

In an embodiment, the n light-emitting units may all emit blue light, but embodiments are not limited thereto.

In an embodiment, the charge generating units may each include an n-type charge generating layer.

The n-type charge generating layer may include a twelfth material and a thirteenth material.

The twelfth material may include an alkali metal, an alkaline earth metal, a lanthanide metal, a transition metal, a post-transition metal, or any combination thereof.

The thirteenth material may include one or more electron transport organic compounds.

The volume ratio of the thirteenth material to the twelfth material may be in a range of about 99:1 to about 80:20.

A thickness of the n-type charge-generating layer may be in a range of about 0.1 nm to about 20 nm.

In an embodiment, each of the charge generating units may further include a p-type charge generating layer.

The p-type charge generating layer may include a fourteenth material and a fifteenth material.

The fourteenth material may include a hole transport organic compound, an inorganic insulator compound, or any combination thereof.

The fifteenth material may include one or more inorganic semiconductor compounds.

For example, the fourteenth material may include a hole transport organic compound, and the volume ratio of the fourteenth material to the fifteenth material may be in a range of about 99:1 to about 80:20.

In embodiments, the fourteenth material may include an inorganic insulator compound, and the volume ratio of the fourteenth material to the fifteenth material may be in a range of about 99:1 to about 50:50.

A thickness of the p-type charge generating layer may be in a range of about 0.1 nm to about 20 nm.

In an embodiment, the first electrode may be an anode, the second electrode may be a cathode, an $n^{th}$ light-emitting unit may be located between the first electrode and the second electrode, an $n-1^{th}$ light-emitting unit located between the first electrode and the $n^{th}$ light-emitting unit, an $n-1^{th}$ charge generating unit located between the $n^{th}$ light-emitting unit and the $n-1^{th}$ light-emitting unit, the $n^{th}$ light-emitting unit may include an $n^{th}$ emission layer, the $n-1^{th}$ light-emitting unit may include an $n-1^{th}$ emission layer, an $n-1^{th}$ hole transport region may be further located between the first electrode and the $n-1^{th}$ emission layer, an $n-1^{th}$ electron transport region may be further located between the $n^{th}$ emission layer and the $n-1^{th}$ charge generating unit, an $n^{th}$ hole transport region may be further located between the $n-1^{th}$ charge generating unit and the $n^{th}$ emission layer, and an $n^{th}$ electron transport region may be further located between the $n^{th}$ emission layer and the second electrode.

The hole transport regions may each include a hole injection layer, a hole transport layer, an electron blocking layer, or any combination thereof, and the electron transport regions may each include a hole blocking layer, an electron transport layer, an electron injection layer, or any combination thereof.

Since each component has the same or similar function as the corresponding component of the embodiment according to FIG. 1 described above, a detailed description thereof will be omitted.

[Apparatus]

The light-emitting device may be included in various apparatuses. For example, a light-emitting apparatus, an authentication apparatus, or an electronic apparatus, which includes the light-emitting device, may be provided.

[Light-Emitting Apparatus]

In the light-emitting apparatus, a color filter may be located on at least one traveling direction of light emitted from the light-emitting device. For example, the light emitted from the light-emitting device may be blue light, but embodiments are not limited thereto.

A first substrate of the light-emitting apparatus may include subpixel areas, and the color filter may include color filter areas respectively corresponding to the subpixel areas. A pixel-defining film may be formed between subpixel areas to define each of the subpixel areas. The color filter may include light-blocking patterns between the color filter areas.

The color filter areas may include a first color filter area emitting first color light, a second color filter area emitting second color light, and a third color filter area emitting third color light, and the first color light, the second color light, and the third color light may have different maximum emission wavelengths from one another. For example, the first color light may be red light, the second color light may be green light, and the third color light may be blue light, but embodiments are not limited thereto.

For example, the color filter areas may each include a quantum dot, or only some of the color filter areas may include a quantum dot.

In an embodiment, the first color filter area may include a red quantum dot, the second color filter area may include a green quantum dot, and the third color filter area may not include a quantum dot. In this regard, the light-emitting device may emit first light, the first color filter area may absorb the first light to emit first first-color light, the second color filter area may absorb the first light to emit second first-color light, and the third color filter area may allow the first light to pass therethrough. In this regard, the first first-color light, the second first-color light, and the first light may have different maximum luminescence wavelengths from one another. The first light may be blue light, the first first-color light may be red light, the second first-color light may be green light, but embodiments are not limited thereto.

In an embodiment, the first color filter area may include a red quantum dot, the second color filter area may include a green quantum dot, and the third color filter area may include a blue quantum dot. The light-emitting device may emit first light, the first color filter area may absorb the first light to emit first first-color light, the second color filter area may absorb the first light to emit second first-color light, and the third color filter area may absorb the first light to emit third first-color light. In this regard, the first first-color light, the second first-color light, and the third first-color light may have different maximum emission wavelengths from one another. The first light may be blue light, the first first-color light may be red light, the second first-color light may be green light, and the third first-color light may be blue light, but embodiments are not limited thereto.

The quantum dot refers to a crystal of a semiconductor compound and may include any material emitting emission wavelengths of different lengths according to the size of the crystal. Accordingly, types of compounds constituting the quantum dot are not particularly limited.

In an embodiment, the quantum dot may include a semiconductor compound material selected from Groups III-VI semiconductor compounds, Groups II-VI semiconductor compounds; Groups III-V semiconductor compounds; Groups IV-VI semiconductor compounds; a Group IV element or compound; and a combination thereof.

For example, the Groups III-VI semiconductor compounds may be selected from: a binary compound such as $In_2S_3$; and a ternary compound selected from AgInS, $AgInS_2$, CuInS, $CuInS_2$, and any mixture thereof, but embodiments are not limited thereto.

For example, the Groups II-VI semiconductor compounds may be selected from a binary compound selected from CdSe, CdTe, ZnS, ZnSe, ZnTe, ZnO, HgS, HgSe, HgTe, MgSe, MgS, and any mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, any mixture thereof; and a quaternary compound selected from CdZnSeS, CdZnSeTe, CdZnSTe, CdHgSeS, CdHgSeTe, CdHgSTe, HgZnSeS, HgZnSeTe, HgZnSTe, and any mixture thereof, but embodiments are not limited thereto.

For example, the Groups III-V semiconductor compounds may be selected from: a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof, but embodiments are not limited thereto.

For example, the Groups IV-VI semiconductor compounds may be selected from: a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; and a quaternary compound selected from SnPbSSe, SnPbSeTe, SnPbSTe, and any mixture thereof, but embodiments are not limited thereto.

For example, the Group IV element or compound may be selected from: a single element compound selected from Si, Ge, and any mixture thereof; and a binary compound selected from SiC, SiGe, and any mixture thereof, but embodiments are not limited thereto.

The binary compound, the ternary compound, or the quaternary compound may exist in particles at uniform concentration, or may exist in the same particle in a state in which a concentration distribution is different.

The quantum dot may have a uniform single structure or a double core-shell structure. For example, the core-shell may include different materials. For example, materials constituting each of the core and the shell may include different semiconductor compounds.

The shell of the quantum dot may serve as a protective layer for maintaining semiconductor characteristics by preventing chemical degeneration of the core and/or may serve as a charging layer for imparting electrophoretic characteristics to the quantum dot. The shell may be a single layer or a multilayer. An interface between the core and the shell may have a concentration gradient in which the concentration of elements existing in the shell decreases toward the center.

Examples of the shell of the quantum dot may include a metal or non-metal oxide, a semiconductor compound, or any combination thereof. For example, the metal or non-metal oxide may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound, such as $MgAl_2O_4$, $CoFe_2O_4$, $NiFe_2O_4$, or $CoMn_2O_4$, but embodiments are not limited thereto. The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but embodiments are not limited thereto.

A diameter of the quantum dot is not particularly limited, but may be, for example, in a range of about 1 nm to about 10 nm. By adjusting the size of the quantum dot, the energy band gap may also be adjusted, thereby obtaining light of various wavelengths in the quantum dot emission layer. Therefore, by using quantum dots of different sizes, a display that emits light of various wavelengths may be implemented.

The size of the quantum dot may be selected to emit red, green, and blue light, so as to constitute a color display. The size of the quantum dot may be configured by combining light of various colors, so as to emit white light.

The quantum dot may be a spherical, pyramidal, multi-arm, or cubic nanoparticle, nanotube, nanowire, nanofiber, or nanoplate particle, but embodiments are not limited thereto.

A full width of half maximum (FWHM) of an emission wavelength spectrum of the quantum dot may be about 45 nm or less. For example, a full width of half maximum of an emission wavelength spectrum of the quantum dot may be about 40 nm or less. For example, a full width of half maximum of an emission wavelength spectrum of the quantum dot may be about 30 nm or less. When the FWHM of the emission wavelength spectrum of the quantum dot is within this range, color purity or color reproduction may be improved. Light emitted through such a quantum dot is irradiated omnidirectionally, thereby providing a wide viewing angle.

The quantum dot may be synthesized by a wet chemical process, an organometallic chemical vapor deposition process, a molecular beam epitaxy process, or a similar process.

According to the wet chemical process, a precursor material is added to an organic solvent to grow a particle crystal. When the crystal grows, the organic solvent serves as a dispersant naturally coordinated to the surface of the quantum dot crystal and controls the growth of the crystal. In this regard, the wet chemical process may be easily performed compared to a vapor deposition process, such as metal organic chemical vapor deposition (MOCVD) and molecular beam epitaxy (MBE), and through a low-cost process, the growth of inorganic nanoparticles may be controlled.

The first color filter area, the second color filter area, and the third color filter area may each include a scattering component, but embodiments are not limited thereto.

The light-emitting apparatus may further include a thin-film transistor in addition to the light-emitting device 1 as described above. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulation layer, or the like.

The active layer may include crystalline silicon, amorphous silicon, organic semiconductor, oxide semiconductor, or the like, but embodiments are not limited thereto.

The light-emitting apparatus may further include a sealing part for sealing the light-emitting device. The sealing part may be located between the color filter and the light-emitting device. The sealing part may allow an image from the light-emitting device to be implemented and may block outside air and moisture from penetrating into the light-emitting device. The sealing part may be a sealing substrate including a transparent glass or a plastic substrate. The sealing part may be a thin film encapsulation layer including organic layers and/or inorganic layers. In case that the sealing part is a thin-film encapsulation layer, the entire display apparatus may be flexible.

The light-emitting apparatus may be used as various displays, light sources, and the like.

[Authentication Apparatus]

The authentication apparatus may be, for example, a biometric authentication apparatus for authenticating an individual by using biometric information of a biometric body (for example, a fingerprint, a pupil, or the like).

The authentication apparatus may further include, in addition to the light-emitting device, a biometric information collector.

[Electronic Apparatus]

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various measuring instruments, meters (for example, meters for a vehicle, an aircraft, and a vessel), projectors, and the like, but embodiments are not limited thereto.

[Preparation Method]

Layers constituting the hole transport region, an emission layer, and layers constituting the electron transport region may be formed by using one or more suitable methods selected from vacuum deposition, spin coating, casting, Langmuir-Blodgett (LB) deposition, ink-jet printing, laser-printing, and laser-induced thermal imaging.

In case that the layers constituting the hole transport region, an emission layer, and layers constituting the electron transport region are formed by vacuum deposition, the deposition may be performed at a deposition temperature in a range of about 100° C. to about 500° C., a vacuum degree in a range of about $10^{-8}$ torr to about $10^{-3}$ torr, and a deposition speed in a range of about 0.01 Å/sec to about 100 Å/sec by taking into account a material to be included in a layer to be formed and the structure of a layer to be formed.

In case that the layers constituting the hole transport region, an emission layer, and layers constituting the electron transport region are formed by spin coating, the spin coating may be performed at a coating speed in a range of about 2,000 rpm to about 5,000 rpm and at a heat treatment temperature in a range of about 80° C. to 200° C. by taking into account a material to be included in a layer to be formed and the structure of a layer to be formed.

[Definitions of Substituents]

The term "$C_1$-$C_{60}$ alkyl group" as used herein refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term $C_3$-$C_{10}$ cycloalkenyl group used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one carbon-carbon double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a carbocyclic aromatic system that has at least one heteroatom selected from N, O, Si, P, and S as a ring-forming atom, in addition to 1 to 60 carbon atoms. The term "$C_1$-$C_{60}$ heteroarylene group" as used herein refers to a divalent group having a carbocyclic aromatic system that has at least one heteroatom selected from N, O, Si, P, and S as a ring-forming atom, in addition to 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the two or more rings may be condensed with each other.

The term "$C_6$-$C_{60}$ aryloxy group" as used herein refers to —$OA_{102}$ (wherein $A_{102}$ is the $C_6$-$C_{60}$ aryl group), and a $C_6$-$C_{60}$ arylthio group used herein refers to —$SA_{103}$ (wherein $A_{103}$ is the $C_6$-$C_{60}$ aryl group).

The term "$C_1$-$C_{60}$ heteroaryloxy group" as used herein refers to —$OA_{104}$ (where $A_{104}$ is the $C_1$-$C_{60}$ heteroaryl group), and the term "$C_1$-$C_{60}$ heteroarylthio group" as used herein refers to —$SA_{105}$ (where $A_{105}$ is the $C_1$-$C_{60}$ heteroaryl group).

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. A detailed example of the monovalent non-aromatic condensed polycyclic group is a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom selected from N, O, Si, P, and S, other than carbon atoms, as a ring-forming atom, and no aromaticity in its entire molecular structure. An example of the monovalent non-aromatic condensed heteropolycyclic group is a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a monocyclic or polycyclic group that includes only carbon as a ring-forming atom and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_5$-$C_{60}$ carbocyclic group, except that as a ring-forming atom, at least one heteroatom selected from N, O, Si, P, and S is used in addition to carbon (the number of carbon atoms may be in a range of 1 to 60).

At least one substituent selected from the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group". In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a compound according to embodiments and a light-emitting device according to embodiments will be described in detail with reference to Synthesis Examples and Examples. The phrase "B was used instead of A" used in describing Synthesis Examples refers to that an identical molar equivalent of B was used in place of A.

EXAMPLES

Example 1

A 15 Ω/cm$^2$ (1,200 Å) ITO glass substrate (a product of Corning Inc.) was cut to a size of 50 mm×50 mm×0.7 mm, sonicated with isopropyl alcohol and pure water each for 5 minutes, and cleaned by exposure to ultraviolet rays and ozone for 30 minutes. The resultant glass substrate was loaded onto a vacuum deposition apparatus.

HAT-CN and CuI were co-deposited at a volume ratio of 97:3 on the ITO anode of the glass substrate to form a hole injection layer having a thickness of 10 nm, and NPB was deposited on the hole injection layer to form a first hole transport layer having a thickness of 240 nm, and TCTA was deposited on the first hole transport layer to form a second hole transport layer having a thickness of 5 nm. KI, CuI, Er and FD23 were co-deposited at a volume ratio of 90:5:3:2 on the second hole transport layer to form an emission layer having a thickness of 19 nm.

T2T was deposited on the emission layer to form a first electron transport layer having a thickness of 5 nm, and TPM-TAZ and Liq were co-deposited at the volume ratio of 1:1 on the first electron transport layer to from a second electron transport layer having a thickness of 25 nm. KI and Yb were co-deposited at the volume ratio of 95:5 to 90:10 on the second electron transport layer to form an electron injection layer having a thickness of 1 nm to 2 nm.

Ag and Mg were co-deposited at a volume ratio of 9:1 on the electron injection layer to form a cathode having a thickness of 14 nm, thereby completing the manufacture of a light-emitting device.

Comparative Example 1

A light-emitting device was manufactured in the same manner as in Example 1, except that, in forming the emission layer, H18 and FD23 were co-deposited at the volume ratio of 97:3.

Evaluation Example 1

The driving voltage, change in the driving voltage, current efficiency, lifespan, and CIE color coordinate of the light-emitting devices manufactured according to Example 1 and Comparative Example 1 were measured by using Keithley SMU 236 and a luminance meter PR650, and results thereof are shown in Table 1. The lifespan ($T_{97}$) is a period of time that was taken until the luminance (@400 nit) was reduced to 97% of initial luminance (100%) after a light-emitting device was driven. The change in the driving voltage is a difference between the initial driving voltage and the driving voltage measured after 500 hours of driving the light-emitting device.

TABLE 1

| | Emission layer | | | Driving voltage (V) | Change in driving voltage (V) | Current efficiency (cd/A) | Lifespan ($T_{97}$) (hr) | Color coordinate (y) |
|---|---|---|---|---|---|---|---|---|
| | First material | Second material | Third material | | | | | |
| Example 1 | KI and CuI | Er | FD23 | 11.2 | 1.5 | 30.2 | 550 | 0.112 |
| Comparative Example 1 | H18 | | FD23 | 11.4 | 2 | 21.4 | 500 | 0.125 |

From the Table 1, it can be seen that the light-emitting device of Example 1 may have improved efficiency and lifespan compared to Comparative Example 1, and in particular, significantly improved efficiency.

The light-emitting device has a high efficiency, and the manufacturing costs therefor may be relatively low.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope as defined by the following claims.

What is claimed is:

1. A light-emitting device comprising:
a first electrode;
a second electrode; and
an interlayer located between the first electrode and the second electrode, wherein
the first electrode is an anode,
the second electrode is a cathode,
the interlayer comprises:
an emission layer; and
a hole transport region located between the first electrode and the emission layer, the emission layer comprises:
a first material including an inorganic semiconductor compound, an inorganic insulator compound, or any combination thereof;
a second material including a lanthanide metal; and
a third material that comprises an organic fluorescent dopant compound, an organometallic phosphorescent dopant compound, an organic delayed fluorescence dopant compound, or any combination thereof,
the hole transport region comprises a hole injection layer,
the hole injection layer comprises:
a fourth material; and
a fifth material,
the fourth material and the fifth material are different from each other,
the fourth material comprises a lanthanide metal halide, transition metal halide, a post-transition metal halide, a tellurium, a lanthanide metal telluride, transition metal telluride, a post-transition metal telluride, a lanthanide metal selenide, a transition metal selenide, a post-transition metal selenide, or any combination thereof, and
wherein for the fifth material;
the fifth material comprises a hole transport organic compound, and a volume ratio of the fourth material to the fifth material is in a range of about 1:99 to about 20:80; or
the fifth material comprises a post-transition metal halide, an alkali metal halide, an alkaline earth metal halide, a lanthanum metal halide, or any combination thereof, and the volume ratio of the fourth material to the fifth material is in a range of about 0:100 to about 50:50.

2. The light-emitting device of claim 1, wherein
the first material comprises an alkali metal halide, an alkaline earth metal halide, a lanthanide metal halide, a transition metal halide, a post-transition metal halide, a tellurium, a lanthanide metal telluride, a transition metal telluride, a post-transition metal telluride, a lanthanide metal selenide, a transition metal selenide, a post-transition metal selenide, or any combination thereof, and
the second material comprises lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or any combination thereof.

3. The light-emitting device of claim 1, wherein the first material comprises NaI, KI, RbI, CsI, NaCl, KCl, RbCl, CsCl, NaBr, KBr, RbBr, CsBr, $MgI_2$, $CaI_2$, $SrI_2$, $BaI_2$, $MgCl_2$, $CaCl_2$, $SrCl_2$, $BaCl_2$, $MgBr_2$, $CaBr_2$, $SrBr_2$, $BaBr_2$, $EuI_3$, $YbI_3$, $SmI_3$, $TmI_3$, $EuI_2$, $YbI_2$, $SmI_2$, $TmI_2$, $EuCl_3$, $YbCl_3$, $SmCl_3$, $TmCl_3$, $EuBr_3$, $YbBr_3$, $SmBr_3$, $TmBr_3$, AgI, CuI, $NiI_2$, $CoI_2$, $BiI_3$, $PbI_2$, $SnI_2$, Te, EuTe, YbTe, SmTe, TmTe, EuSe, YbSe, SmSe, TmSe, ZnTe, CoTe, ZnSe, CoSe, $Bi_2Te_3$, $Bi_2Se_3$, or any combination thereof.

4. The light-emitting device of claim 1, wherein the first material comprises KI, RbI, CsI, CuI, or any combination thereof.

5. The light-emitting device of claim 1, wherein the second material comprises Yb, Tm, Sm, Eu, Er, or any combination thereof.

6. The light-emitting device of claim 1, wherein a volume of the first material is greater than or equal to a volume of the second material.

7. The light-emitting device of claim 1, wherein
the hole transport region further comprises a hole transport layer, an electron blocking layer, or any combination thereof,
the interlayer further comprises an electron transport region located between the emission layer and the second electrode, and
the election transport region comprises a hole blocking layer, an electron transport layer, an electron injection layer, or any combination thereof.

8. The light-emitting device of claim 7, wherein
the electron injection layer comprises a sixth material, and
the sixth material comprises an alkali metal halide, an alkaline earth metal halide, a lanthanide metal halide, or any combination thereof.

9. The light-emitting device of claim 8, wherein the electron injection layer consists of the sixth material.

10. The light-emitting device of claim 8, wherein
the electron injection layer further comprises a seventh material,
the sixth material and the seventh material are different from each other, and
the seventh material comprises an alkali metal, an alkaline earth metal, a lanthanide metal, or any combination thereof.

11. The light-emitting device of claim 10, wherein the sixth material is represented by Formula X, and the seventh material is represented by Formula Y:

$$A_nB_m \quad \text{<Formula X>}$$

$$C \quad \text{<Formula Y>}$$

wherein in Formulae X and Y,
each of A and C independently comprise an alkali metal, an alkaline earth metal, a lanthanide metal, or any combination thereof,
B is a halogen,
n and m are each independently an integer of 1 or more that makes the sixth material neutral, and
A and C are different from each other.

12. The light-emitting device of claim 7, wherein
the hole transport layer is in direct contact with the emission layer,
the hole transport layer comprises:
an eighth material; and
a ninth material,
the eighth material and the ninth material are different from each other, the eighth material comprises a hole transport organic compound, and the ninth material comprises an alkali metal halide, an alkaline earth metal halide, a lanthanide metal halide, or any combination thereof.

13. The light-emitting device of claim 7, wherein the electron transport layer is in direct contact with the emission layer, the electron transport layer comprises:
   a tenth material; and
   an eleventh material, the tenth material and the eleventh material are different from each other, the tenth material comprises an electron transport organic compound, and the eleventh material comprises an alkali metal halide, an alkaline earth metal halide, a lanthanide metal halide, or any combination thereof.

14. An apparatus comprising:

a thin-film transistor comprising a source electrode, a drain electrode, and an activation layer; and a light-emitting device of claim 1, wherein the first electrode of the light-emitting device is electrically connected with one of the source electrode and the drain electrode of the thin-film transistor.

15. The apparatus of claim 14, further comprising a color filter located on a path through which light from the light-emitting device is emitted.

* * * * *